(12) United States Patent
Miyasaka

(10) Patent No.: US 7,381,449 B2
(45) Date of Patent: Jun. 3, 2008

(54) METHOD FOR COATING MATERIAL, METHOD OF MANUFACTURING COLOR FILTER SUBSTRATE, METHOD OF MANUFACTURING ELECTROLUMINESCENCE DISPLAY DEVICE, METHOD OF MANUFACTURING PLASMA DISPLAY DEVICE, AND EJECTION DEVICE

(75) Inventor: Yoichi Miyasaka, Suwa (JP)

(73) Assignee: Seiko Epson Corporation (JP)

( * ) Notice: Subject to any disclaimer, the term of this patent is extended or adjusted under 35 U.S.C. 154(b) by 352 days.

(21) Appl. No.: 11/062,348

(22) Filed: Feb. 18, 2005

(65) Prior Publication Data

US 2005/0185007 A1  Aug. 25, 2005

(30) Foreign Application Priority Data

Feb. 19, 2004  (JP)  ............................. 2004-043020

(51) Int. Cl.
| | |
|---|---|
| *B41J 29/38* | (2006.01) |
| *B05D 1/02* | (2006.01) |
| *B05D 5/00* | (2006.01) |
| *B05D 7/00* | (2006.01) |
| *B28B 19/00* | (2006.01) |
| *B29B 15/10* | (2006.01) |

(52) U.S. Cl. .............................. 427/427.3; 427/427.1; 347/9; 347/16

(58) Field of Classification Search .................... 347/9, 347/16; 427/427.1, 427.3
See application file for complete search history.

(56) References Cited

U.S. PATENT DOCUMENTS

| 6,254,218 | B1 | 7/2001 | Suzuki et al. |
| 6,660,332 | B2 | 12/2003 | Kawase et al. |
| 6,810,919 | B2 | 11/2004 | Seki et al. |
| 6,939,407 | B2 | 9/2005 | Kawase et al. |
| 6,948,533 | B2 | 9/2005 | Seki et al. |
| 2001/0024227 | A1* | 9/2001 | Sekiya ........................ 347/101 |
| 2003/0063154 | A1* | 4/2003 | Goto ........................... 347/40 |
| 2003/0186613 | A1* | 10/2003 | Kawase ....................... 445/60 |
| 2004/0009303 | A1* | 1/2004 | Ito et al. ...................... 427/421 |
| 2004/0100610 | A1 | 5/2004 | Kawase et al. |
| 2004/0246298 | A1* | 12/2004 | Ito et al. ....................... 347/40 |
| 2005/0185006 | A1* | 8/2005 | Miyasaka ..................... 347/9 |
| 2005/0268984 | A1 | 12/2005 | Seki et al. |

FOREIGN PATENT DOCUMENTS

CN          1167925          12/1997

(Continued)

OTHER PUBLICATIONS

Communication from Chinese Patent Office regarding counterpart application.

*Primary Examiner*—Hai Pham
*Assistant Examiner*—Kainoa Wright
(74) *Attorney, Agent, or Firm*—Harness, Dickey & Pierce, P.L.C.

(57) ABSTRACT

An ejecting head ejects liquid material to a part to be ejected from a first nozzle during a first san period and from a second nozzle during a second scan period. A scanning unit relatively moves at least one of the ejecting head and a stage in the X-axis direction with respect to the other between the first scan period and the second scan period.

4 Claims, 29 Drawing Sheets

FOREIGN PATENT DOCUMENTS

| | | |
|---|---|---|
| JP | 6-228853 | 8/1994 |
| JP | 09-101412 | 4/1997 |
| JP | 2001-261373 | 9/2001 |
| JP | 2002-221616 | 8/2002 |
| JP | 2002221616 A * | 8/2002 |
| JP | 2002-283621 | 10/2002 |
| JP | 2003251243 A * | 9/2003 |
| JP | 2003-326211 | 11/2003 |
| JP | 2004-004803 | 1/2004 |
| WO | WO03/061349 | 7/2003 |

* cited by examiner

# METHOD FOR COATING MATERIAL, METHOD OF MANUFACTURING COLOR FILTER SUBSTRATE, METHOD OF MANUFACTURING ELECTROLUMINESCENCE DISPLAY DEVICE, METHOD OF MANUFACTURING PLASMA DISPLAY DEVICE, AND EJECTION DEVICE

RELATED APPLICATIONS

This application claims priority to Japanese Patent Application No. 2004-043020 filed Feb. 19, 2004 which is hereby expressly incorporated by reference herein in its entirety.

BACKGROUND

1. Technical Field

The present invention relates to an ejection device and a method for coating a material and, more particularly, to an ejection device and a method for coating a material that are suitable for manufacturing a color filter substrate, an electroluminescence display device, and a plasma display device.

2. Related Art

Inkjet devices are known for manufacturing color filters, electroluminescence display devices, and the like (e.g., Japanese Unexamined Patent Publication No. 2002-221616).

Parts to be ejected (e.g., an area to which color elements are ejected) become larger as display device sizes increase. If the part to be ejected becomes large, the frequency that one nozzle ejects materials to one part to be ejected increases. Meanwhile, the volume of the material ejected each time may slightly fluctuate at each nozzle due to errors etc. during manufacturing of inkjet heads. In such a case, if the material is ejected to one part from the same nozzle several times, the total volume of applied material may greatly differ at each part to be ejected.

In view of such a situation, the present invention aims to prevent the accumulation of errors in the ejected volume at a part to be ejected.

SUMMARY

A method for coating a material of one aspect of the present invention is one in which a liquid material is applied to a base substrate using an ejection device provided with an ejection head part including a plurality of nozzles arranged in an X-axis direction and a stage. The method includes the following steps: (A) setting the base substrate including a part to be ejected on the stage; (B) changing a relative position of the ejection head part with respect to the stage to a first direction that is substantially orthogonal to the X-axis direction while maintaining a relative x-coordinate of the ejection head part with respect to the stage to a first relative x-coordinate; (C) ejecting the liquid material from a first nozzle to the part to be ejected upon positioning the first nozzle among the plurality of nozzles at a region corresponding to the part to be ejected; (D) changing the relative position of the ejection head part with respect to the stage to the X-axis direction such that a relative x-coordinate of the ejection head part with respect to the stage coincides with a second relative x-coordinate; (E) changing the relative position of the ejection head part with respect to the stage to an opposite direction of the first direction while maintaining the relative x-coordinate of the ejection head part with respect to the stage to the second relative x-coordinate; and (F) ejecting the liquid material from a second nozzle to the part to be ejected upon positioning the second nozzle among the plurality of nozzles at the region corresponding to the part to be ejected.

The above-mentioned construction causes variations in volume to be less accumulated in one part to be ejected even though a volume of the material ejected from the nozzle. at one ejection may vary for every nozzle.

The method according to the aspect of the present invention further includes the following steps: (G) removing the base substrate from the stage after step (F); (H) setting a second base substrate on the stage, the second base substrate including a second part to be ejected; (I) changing the relative position of the ejection head part with respect to the stage to the first direction while maintaining the relative x-coordinate of the ejection head part with respect to the stage to the second relative x-coordinate; (J) ejecting the liquid material from a third nozzle to the part to be ejected upon positioning the third nozzle among the plurality of nozzles at a region corresponding to the part to be ejected; (K) changing the relative position of the ejection head part with respect to the stage to the X-axis direction such that the relative x-coordinate of the ejection head part with respect to the stage coincides with the first relative x-coordinate; (L) changing the relative position of the ejection head part with respect to the stage to the opposite direction while maintaining the relative x-coordinate of the ejection head part with respect to the stage to the first relative x-coordinate; and (M) ejecting the liquid material from a fourth nozzle to the part to be ejected upon positioning the fourth nozzle among the plurality of nozzles at the region corresponding to the part to be ejected.

The above-mentioned construction reduces the number of times the ejecting head or the stage is transferred in the case where application and scanning is conducted to a plurality of base substrates on which the material is sequentially applied in more than two scan periods.

The present invention can be embodied in various aspects, for examples, a method of manufacturing color filter substrates, a method for manufacturing electroluminescence display devices, a method for manufacturing plasma display devices, etc.

An ejection device of another aspect of the present invention includes: an ejection head part including a first nozzle and a second nozzle, both being arranged in an X-axis direction; a stage on which a base substrate including a part to be ejected is placed; and a scanning unit relatively moving at least one of the ejection head part and the stage to a Y-axis direction that is substantially orthogonal to the X-axis with respect to the other during a first scan period and a second scan period. The scanning unit relatively moves at least one of the ejection head part and the stage to the X-axis direction with respect to the other such that the ejection head part ejects a liquid material from the first nozzle to the part to be ejected during the first scan period and ejecting the liquid material from the second nozzle to the part to be ejected during the second scan period.

The above-mentioned construction reduces the accumulation of variations in volume in one part to be ejected even though a volume of the material ejected from the nozzle at one ejection is varied for every nozzle.

DETAILED DESCRIPTION

First Embodiment

A. Entire Configuration of Ejection Device 100R

Figure 1:
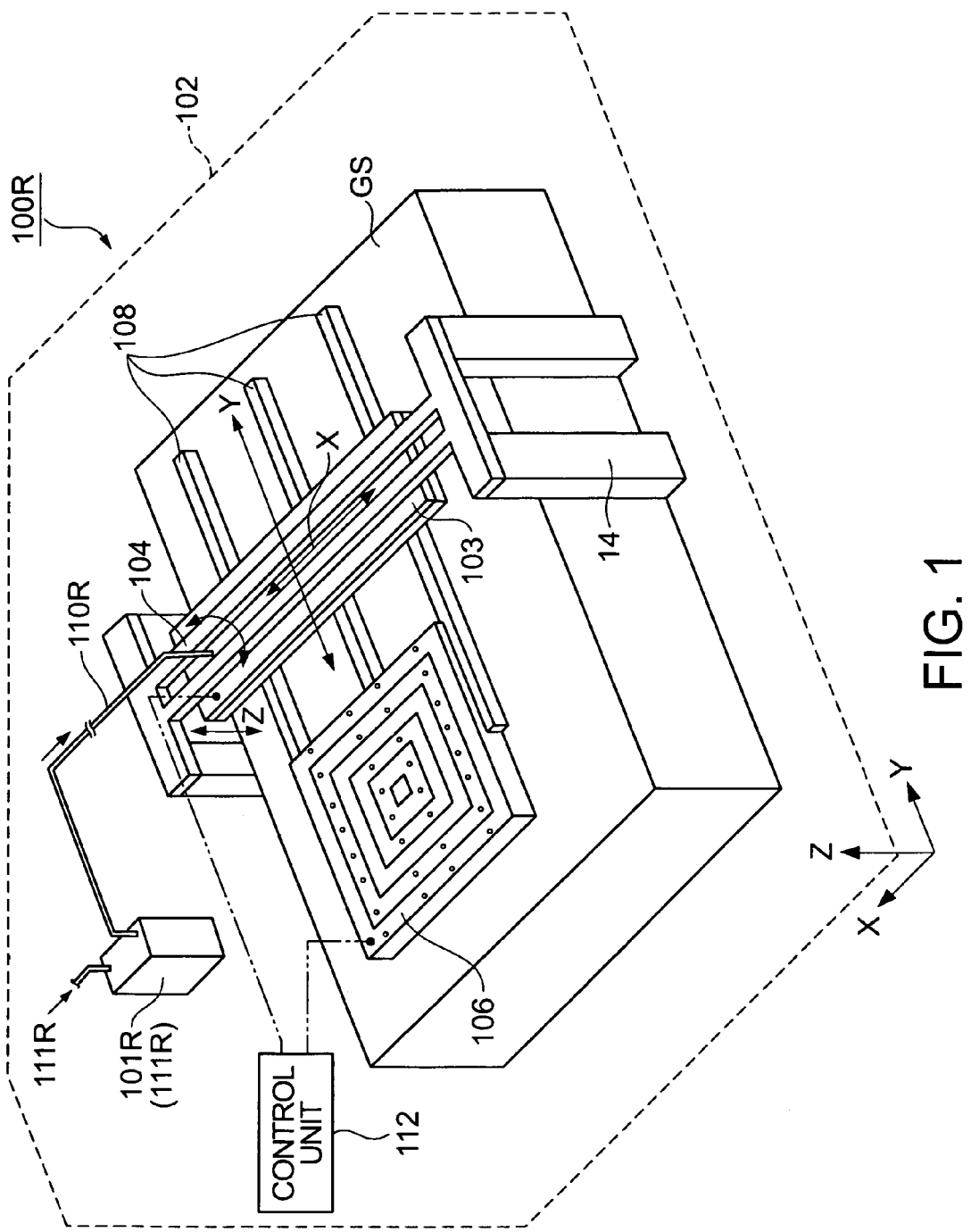
FIG. 1 is a schematic drawing illustrating an ejection device of a first embodiment of the present invention.

As shown in FIG. 1, an ejection device 100R is a device for coating a material that includes a tank 101R in which a liquid color filter material 111R is stored, a tube 110R and an ejecting and scanning part 102 into which the color filter material 111R is provided from the tank 101R through the tube 110R. The ejecting and scanning part 102 includes a ground stage GS, an ejection head part 103, a first position control unit 104, a stage 106, a second position control unit 108, and a control unit 112.

The ejection head part 103 has a plurality of heads 114 (FIG. 2) located at the side that faces the stage 106 for ejecting a liquid color filter material 111R. Each of the plurality of heads 114 ejects droplets of the liquid color filter material 111R in response to a signal from the control unit 112. The tank 101R and the plurality of heads 114 in the ejection head part 103 are connected with the tube 110R such that the liquid color filter material 111R is supplied to each of the plurality of heads 114 from the tank 101R.

The liquid color filter material 111R corresponds to "a liquid material" of the present invention.

"The liquid material" means a material having a viscosity allowing the material to be ejected as a droplet from the nozzle of a head 114 that will be described later. In this case, the material can be both water-base and oil-base material. It is sufficient to have fluidity (viscosity) allowing the material to be ejected from the nozzle, and it can even contain a solid matter as long as it can be treated as fluid as a whole.

The first position control unit 104 moves the ejection head part 103 along an X-axis direction and a Z-axis direction that is orthogonal to the X-axis direction in response to a signal from the control unit 112. In addition, the first position control device 104 has a function for rotating the ejection head part 103 around an axis that is parallel to the Z-axis. In the embodiment, the Z-axis direction refers to a direction that is parallel to the vertical direction (in other words, the direction of gravitational acceleration).

Specifically, the first position control unit 104 includes a pair of linear motors extending in the X-axis direction, a pair of X-axis guide rails extending in the X-axis direction, an X-axis air slider, a rotation unit, and a supporting structure 14. The supporting structure 14 fixes the pair of linear motors, the pair of X-axis guide rails, the X-axis air slider, and the rotation unit at a position located apart from the stage 106 by a predetermined distance in the Z-axis direction. In contrast, the X-axis air slider is movably supported by the pair of X-axis guide rails. The X-axis air slider moves in the X-axis direction along the pair of X-axis guide rails forced by the pair of linear motors. Since the ejection head part 103 is coupled to the X-axis air slider with the rotation unit, the ejection head part 103 moves in the X-axis direction together with the X-axis air slider. Here, the ejection head part 103 is supported by the X-axis air slider such that nozzles, which will be described later, in the ejection head part 103 face the stage 106. In addition, the rotation unit has a servomotor and a function for rotating the ejection head part 103 around an axis that is parallel to the Z-axis.

The second position control unit 108 moves the stage 106 along the Y-axis direction that is orthogonal to the X-axis direction and the Z-axis direction in response to a signal from the control unit 112. In addition, the second position control device 108 has a function for rotating the stage 106 around an axis that is parallel to the Z-axis. Specifically, the second position control unit 108 includes a pair of linear motors extending in the Y-axis direction, a pair of Y-axis guide rails extending in the Y-axis direction, a Y-axis air slider, a supporting base, and a θ table. The pair of linear motors and the Y-axis guide rails are located on the ground stage GS. In contrast, the Y-axis air slider is movably supported by the pair of Y-axis guide rails. The Y-axis air slider moves in the Y-axis direction along the pair of Y-axis guide rails forced by the pair of linear motors. Since the Y-axis air slider is coupled to the back face of the stage 106 with the supporting base and the θ table, the stage 106 moves in the Y-axis direction together with the Y-axis air slider. In addition, the θ table has a motor and a function for rotating the stage 106 around an axis that is parallel to the Z-axis.

In this specification, the first position control unit 104 and the second position control unit 108 may be referred as "a scanning unit."

The X-axis, Y-axis, and Z-axis direction in the embodiment coincide with the direction in which one of either the ejection head part 103 or stage 106 moves relative to the other. In addition, the virtual origin of XYZ coordinates system that defines the X-axis, Y-axis, and Z-axis direction is fixed at a reference part of the ejection device 100R. X-coordinate, Y-coordinate, and Z-coordinate in the specification means the coordinate in such XYZ coordinates system. The virtual origin may be fixed at not only the reference part but also the stage 106 or the ejection head part 103.

As described above, the ejection head part 103 is moved in the X-axis direction by the first position control unit 104. On the other hand, the stage 106 is moved in the Y-axis direction by the second position control unit 108. Consequently, the relative position of the head 114 with respect to the stage 106 is changed by the first position control unit 104 and the second position control unit 108. More specifically, by the above-mentioned movements, the ejection head part 103, the head 114 or nozzles 118 (FIG. 2) are relatively moved in the X-axis direction and the Y-axis direction as they keep a predetermined distance in the Z-axis direction from a part to be ejected that is fixed on the stage 106, namely a scanning is relatively conducted. Here, the ejection head part 103 may move in the Y-axis direction with respect to a quiescent part to be ejected. The color filter material 111R can be ejected from the nozzles 118 (FIG. 2) during the period in which the ejection head part 103 moves between two predetermined points along the Y-axis direction. "A relative move" or "a relative scan" inclusively means that at least one of a side that ejects the liquid color filter material 111R and a side at which the ejected material strikes (the part to be ejected side) is moved to the other.

In addition, that the ejection head part 103, the head 114 or the nozzles 118 (FIG. 2) moves relatively means that these relative positions change with respect to the stage, a base substrate, or the part to be ejected. Therefore, in the specification, even though the case where only the stage 106 moves while the ejection head part 103, head group 114G, the head 114, or nozzles 118 remain stationary with respect to the ejection device 100R, it is described that the ejection head part 103, the head group 114G, the head 114, or the nozzles 118 move relatively with respect to the stage 106, the base substrate, or the part to be ejected. Also, a combination of the relative scan or relative move, and the ejection of the material may be referred as "application and scanning."

The ejection head part 103 and the stage 106 further have a freedom degree of parallel transition and rotation other than the above-described ones. However, in the embodiment, other freedom degrees than above-mentioned is not described in order to simplify the explanation.

The control unit 112 is constructed to receive eject data from an outside information processor, the data showing a relative position where the liquid color filter material 111R should be ejected. Detailed construction and function of the control unit 112 are described later.

B. Head

Figure 2:
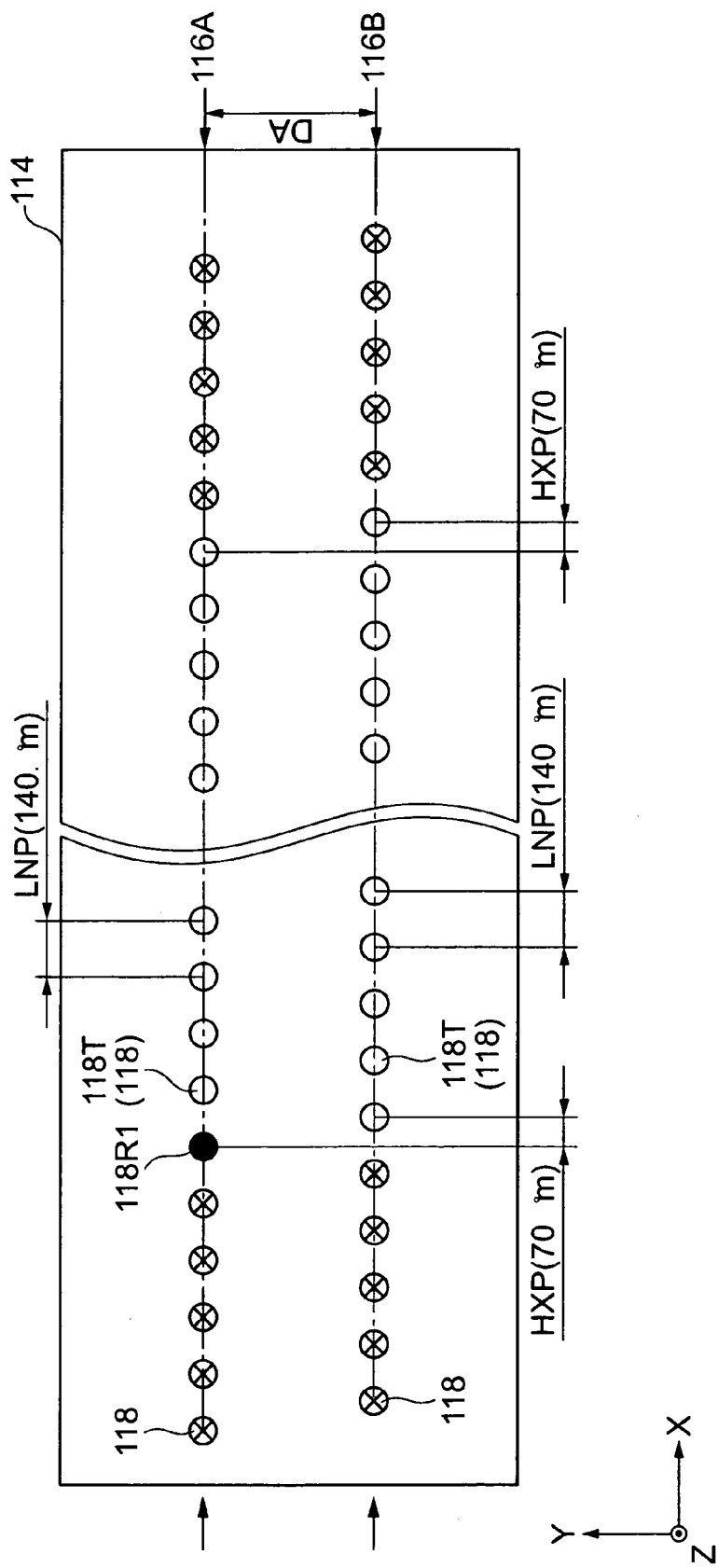
FIG. 2 is a schematic drawing illustrating an arrangement of nozzles in a head of the first embodiment.

The head 114 shown in FIG. 2 is one of the plurality of heads 114 included in the ejection head part 103. FIG. 2 is a diagram illustrating the bottom face of the head 114 viewed from the stage 106. The head 114 has nozzle lines 116A and 116B extending in X-axis direction. The nozzle lines 116A and 116B are constructed with a plurality of nozzles 118 arranged in X-axis direction with almost equal pitch. The plurality of nozzles 118 are arranged such that a nozzle pitch in the X-axis direction HXP in the head 114 is approximately 70 μm. Here, "the nozzle pitch HXP in the X-axis direction in the head 114" corresponds to the pitch among a plurality of nozzle images that are obtained by projecting all of the nozzles 118 in the head 114 on the X-axis from the direction that is orthogonal to the X-axis direction.

The number of nozzles 118 in the nozzle lines 116A and 116B is 180. Each of ten nozzles located at both ends of the nozzle lines 116A and 116B are set as "rested nozzle". The color filter material 111R is not ejected from these 20 rested nozzles. For this reason, 160 out of 180 nozzles 118 function as nozzles 118 that eject the liquid color filter material 111R. In the specification, these 160 nozzles 118 may be described as "ejection nozzles 118T".

The number of nozzles 118 in one head 114 is not limited to 180. For example, three hundred sixty nozzles may be arranged on head 114.

Figure 3A:
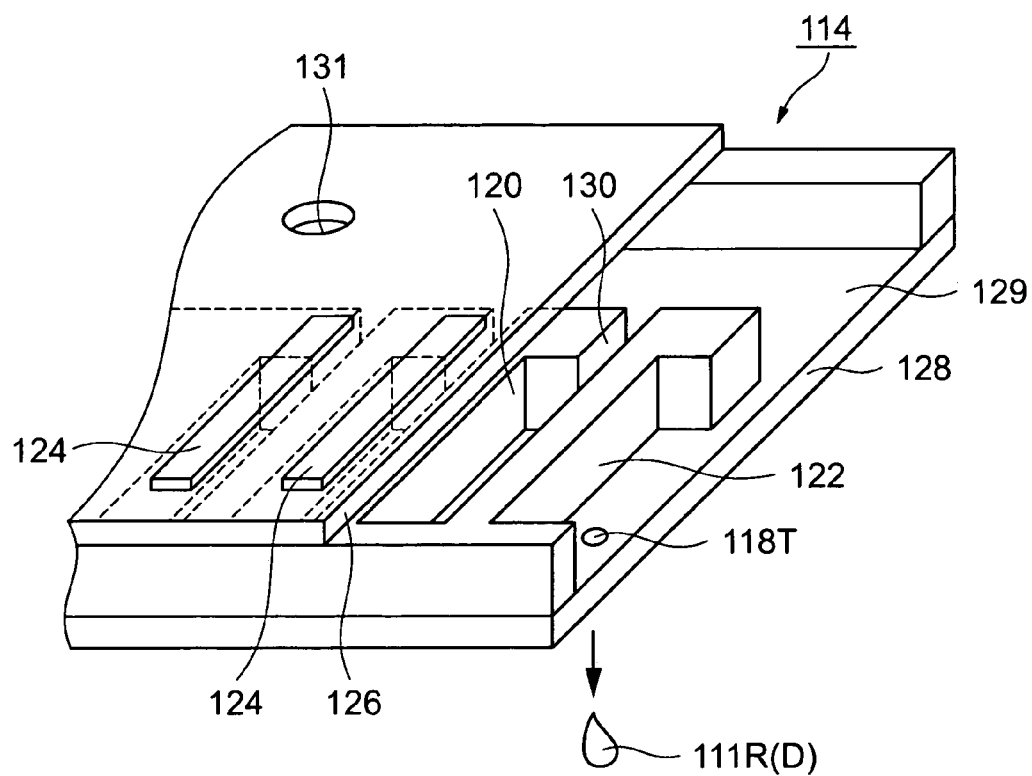
FIGS. 3A and 3B are schematic drawings illustrating an ejection part in the head of the first embodiment.
Figure 3B:
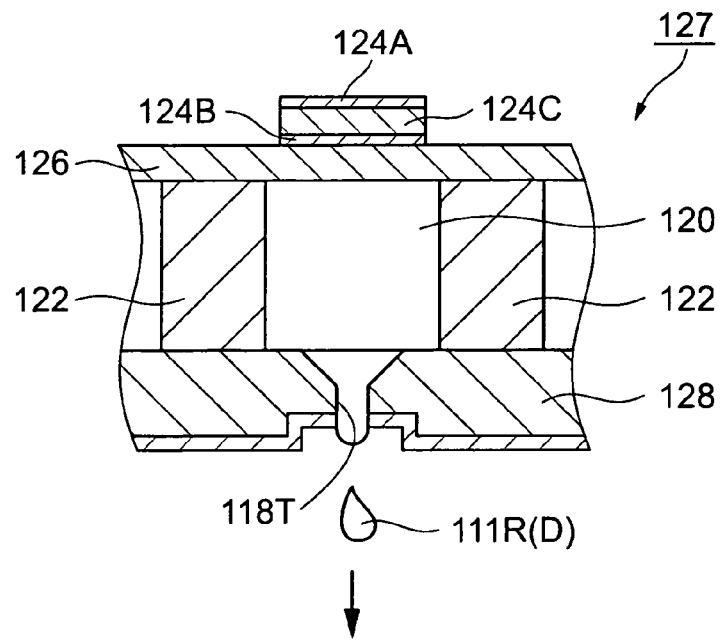

As shown in FIG. 3A and FIG. 3B, each head 114 is an ink-jet head. More specifically, each head 114 has a vibrating plate 126 and a nozzle plate 128. A liquid storage 129 is provided between the vibrating plate 126 and the nozzle plate 128. The liquid storage 129 is always filled with the color filter material 111R that is provided from the two tanks 101R (FIG. 1) through an opening 131.

A plurality of partitions 122 are located between the vibrating plate 126 and the nozzle plate 128. And a part that is surrounded by the vibrating plate 126, the nozzle plate 128 and a pair of the partitions 122 is a cavity 120. Each cavity 120 is provided opposite a nozzle 118, so that there is an equal number of cavities 120 and nozzles 118. The liquid color filter material 111R is provided into the cavity 120 from the liquid store 129 through a feed opening 130 that is located between the pair of partitions 122.

A vibrator 124 is provided on the vibrating plate 126 corresponding to each cavity 120. The vibrator 124 includes a piezoelectric element 124C, a pair of electrodes 124A and 124B that sandwich the piezoelectric element 124C. The liquid color filter material 111R is ejected from the correspondent nozzle 118 by applying a driving voltage between the pair of electrodes 124A and 124B. The shape of the nozzle 118 is adjusted such that the liquid color filter material 111R is ejected from the nozzle 118 in the Z-axis direction.

Here, "the liquid material" in the specification means a material having a viscosity allowing the material to be ejected from the nozzle. In this case, the material can be both water-base and oil-base material. It is sufficient to have fluidity (viscosity) allowing the material to be ejected from the nozzle, and it can even contain a solid matter as long as it can be treated as fluid as a whole.

The control unit 112 (FIG. 1) may be constructed to provide an independent signal to each of the vibrators 124. Therefore, a volume of the liquid material that is ejected from the nozzle 118 may be controlled for each nozzle 118 corresponding to the signal from the control unit 112. In this case, the volume of the liquid material that is ejected from each nozzle 118 may be changed within a range of 0-42 pl (pico-liter). In addition, the control unit 112 may set a nozzle 118 that ejects during the application and scanning, and a nozzle 118 that does not eject, which will be described later.

In the specification, a part that includes the one nozzle 118, the cavity 120 corresponding to the nozzle 118 and the vibrator 124 corresponding to the cavity 120 may be referred as "an ejecting unit 127." According to such description, the one head 114 has the ejecting units 127 of the same number as that of the nozzles 118. Instead of the piezoelectric element, the ejecting unit 127 may have an electrothermal converting element. That is, the ejecting unit 127 may have a structure in which the material is ejected making use of a thermal expansion of the material with the electrothermal converting element.

C. Ejection Head Part

Figure 4:
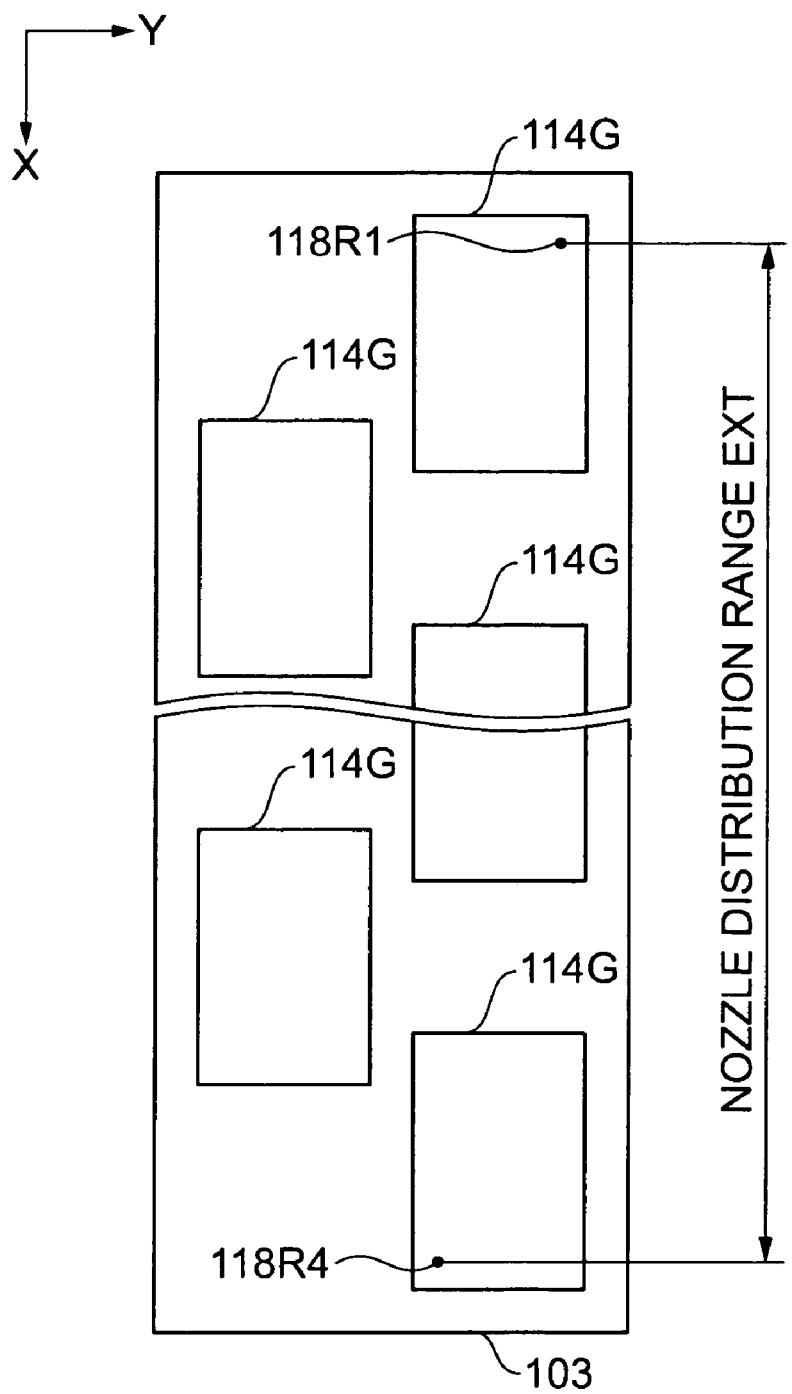
FIG. 4 is a schematic drawing illustrating an ejection head part of the first embodiment.

Here, FIG. 4 is a view of the ejection head part 103 as seen from a side of the stage 106. Therefore, the orthogonal direction to the figure is the Z-axis direction. Also, the up-and-down direction in FIG. 4 is the X-axis direction and the right-and-left direction is the Y-axis direction.

As shown in FIG. 4, the ejection head part 103 has a plurality of head groups 114G each of which has nearly the same structure. In the embodiment, the number of head groups 114G included in the ejection head part 103 is 20. Two lines extending in the X-axis direction are constructed with 20 head groups 114G. Each head group 114G includes four heads 114 that are adjacent to each other in the Y-axis direction, which will be described later.

Figure 5:
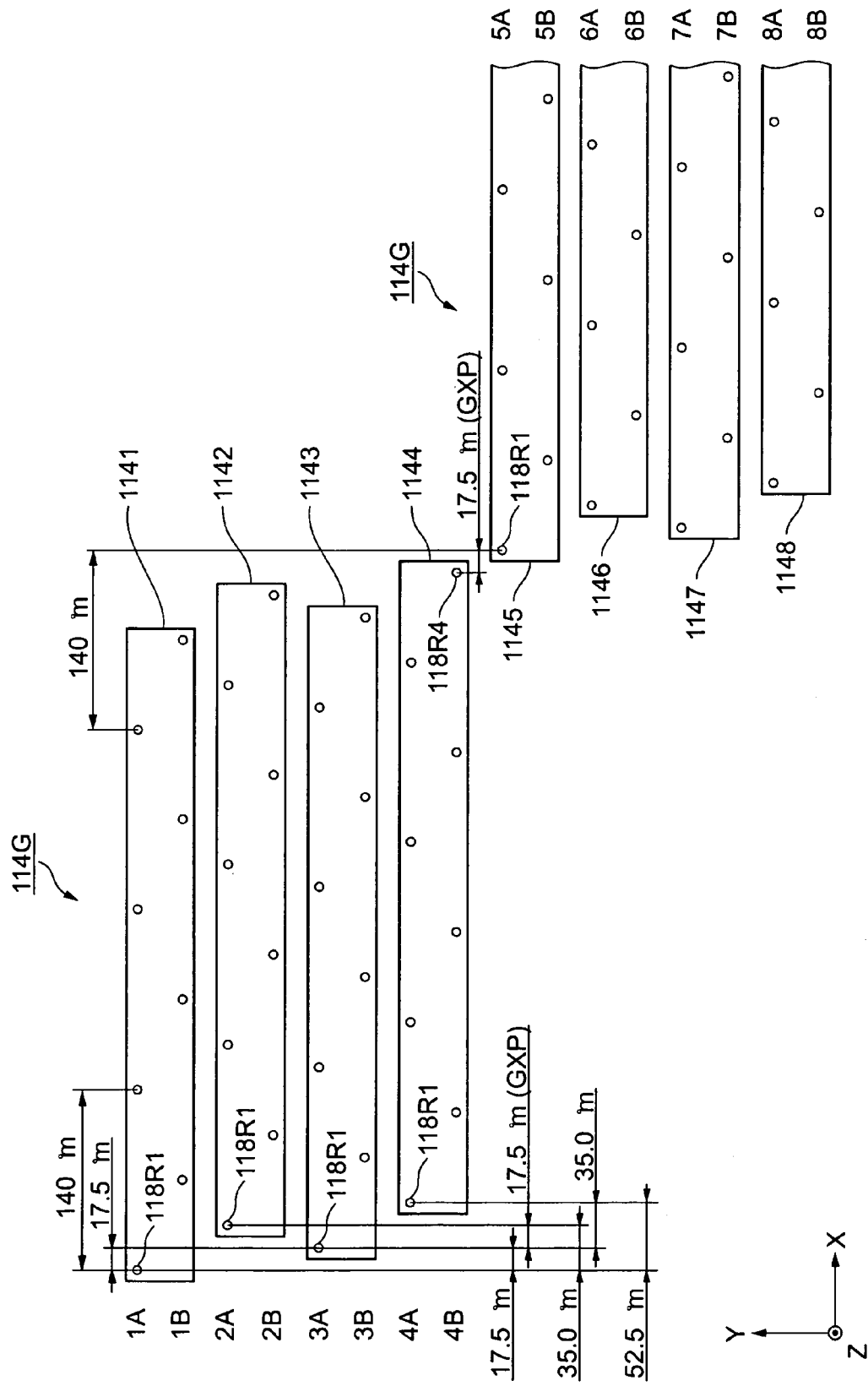
FIG. 5 is a schematic drawing illustrating a head group of the first embodiment.

As shown in FIG. 5, each head group 114G includes four heads 114 that are adjacent to each other in the Y-axis direction. Four heads 114 are arranged in the head group 114 such that a nozzle pitch GXP in the X-axis direction in the head group 114G is ¼ times the nozzle pitch HXP in the X-axis direction in the head 114. More specifically, in the head group 114G, with respect to an x-coordinate of a first reference nozzle 118R1 of one head 114, x-coordinates of the first reference nozzle of other heads 114 are shifted in the X-axis direction by j/4 times the nozzle pitch HXP without overlapping. Here, j is a natural number from one to three. Therefore, the nozzle pitch GXP in the X-axis direction in the head group 114G is ¼ times the nozzle pitch HXP.

In the embodiment, since the nozzle pitch HXP in the X-axis direction in the head 114 is approximately 70 μm, the nozzle pitch GXP in the X-direction in the head group 114G is approximately 17.5 μm, that is ¼ times the HXP. Here, "the nozzle pitch HXP in the X-axis direction in the head group 114G" corresponds to the pitch among a plurality of nozzle images that are obtained by projecting all of the nozzles 118 in the head group 114G on the X-axis from the direction that is orthogonal to the X-axis direction.

As a matter of course, the number of heads 114 included in the head group 114G is not limited to 4. The head group 114G may include N number of heads 114. Here, N is a natural number of more than one. In the case where the head group 114G includes N number of heads 114, N number of heads 114 are arranged in the head group 114G such that the nozzle pitch GXP is 1/N times the nozzle pitch HXP. Alternatively, with respect to an x-coordinate of the first reference nozzle 118R1 of one in N number of heads 114, x-coordinates of the first reference nozzle of the other (N-1) number heads 114 are shifted in the X-axis direction by j/N times the nozzle pitch HXP without overlapping. In this case, j is a natural number from one to (N-1).

The relative positional relationship between heads 114 of the embodiment will be specifically described below.

Figure 8:
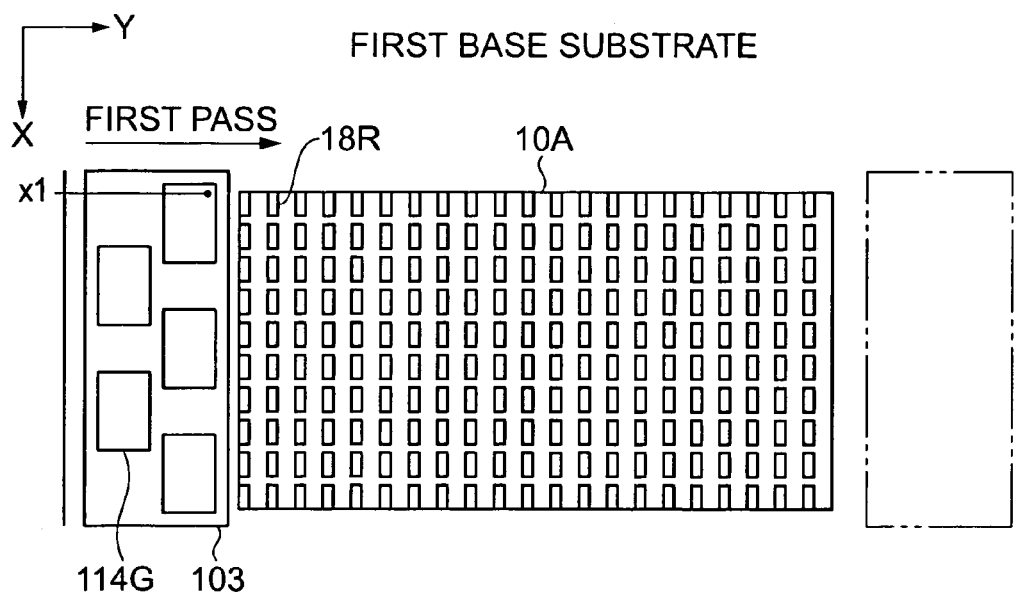
FIG. 8 is a schematic drawing illustrating an application process of the first embodiment, in which a first scan period for a first base substrate is schematically illustrated.
Figure 9:
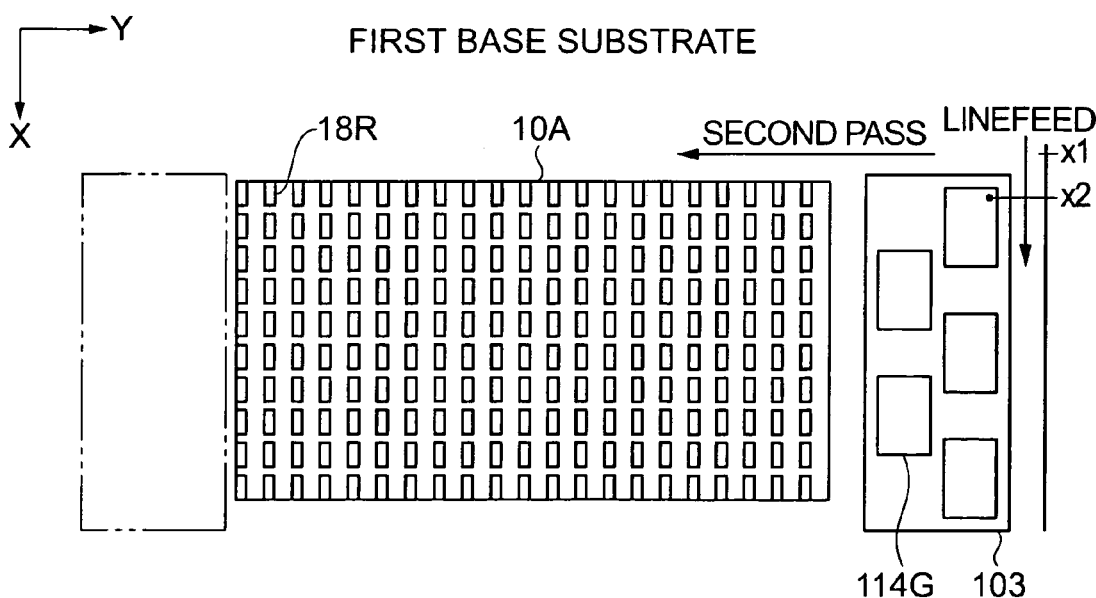
FIG. 9 is a schematic drawing illustrating an application process of the first embodiment, in which a second scan period for the first base substrate is schematically illustrated.

In order to simplify the explanation, four heads 114 included in the head group 114G shown in the leftmost part of FIG. 5 are described as heads 1141, 1142, 1143, and 1144 from top down, respectively. Likewise, four heads 114 included in the head group 114G shown second head groups from the left in FIG. 8 and FIG. 9 are described as heads 1145, 1146, 1147, and 1148 from top down, respectively.

As shown in FIG. 5, nozzle lines 116A and 116B in the head 1141 are described as nozzle lines 1A and 1B, respectively. Similarly, the nozzle lines 116A and 116B in other heads are described as follows: 2A and 2B in the head 1142; 3A and 3B in the head 1143; and 4A and 4B in the head 1144. Likewise, the nozzle lines 116A and 116B in other heads are described as follows: 5A and 5B in the head 1145; 6A and 6B in the head 1146; 7A and 7B in the head 1147; and 8A and 8B in the head 1148.

Each of nozzle lines 1A through 8B actually includes 90 nozzles 118. As mentioned above, 90 nozzles are arranged in the X-axis direction in each of nozzle lines 1A through 8B. However, in FIG. 5, nozzles in each of nozzle lines 1A through 8B are illustrated as four ejection nozzles 118T (nozzles 118) in order to simplify the explanation. Also, in FIG. 5, the leftmost nozzle 118 in nozzle line 1A is the first reference nozzle 118R1 in the head 1141. Likewise, each leftmost nozzle 118 in nozzle lines 2A, 3A, 4A, and 5A is the first reference nozzle 118R1 in each of the heads 1142, 1143, 1144, and 1145. Here, the left direction in FIG. 5 is the negative direction of the X-axis direction.

The absolute value of the difference between the x-coordinate of the first reference nozzle 118R1 in the head 1141 and the x-coordinate of the first reference nozzle 118R1 in the head 1142 is ¼ times a nozzle pitch LNP, namely ½ times the nozzle pitch HXP. In the example shown in FIG. 5, the position of the first reference nozzle 118R1 in the head 1141 is shifted in the negative direction of the X-axis direction (the left direction in FIG. 5) by ¼ times the nozzle pitch LNP with respect to the position of the first reference nozzle 118R1 in the head 1142. However, the direction in which the head 1141 is shifted with respect to the head 1142 may be the positive direction of the X-axis direction (the right direction in FIG. 5).

The absolute value of the difference between the x-coordinate of the first reference nozzle 118R1 in the head 1143 and the x-coordinate of the first reference nozzle 118R1 in the head 1144 is ¼ times the nozzle pitch LNP, namely ½ times the nozzle pitch HXP. In the example shown in FIG. 5, the position of the first reference nozzle 118R1 in the head 1143 is shifted in the negative direction of the X-axis direction (the left direction in FIG. 5) by ¼ times the nozzle pitch LNP with respect to the position of the first reference nozzle 118R1 in the head 1144. However, the direction in which the head 1143 is shifted with respect to the head 1144 may be the positive direction of the X-axis direction (the right direction in FIG. 5).

The absolute values of the difference between the x-coordinate of the first reference nozzle 118R1 in the head 1142 and the x-coordinate of the first reference nozzle 118R1 in the head 1143 is ⅛ or ⅜ times the nozzle pitch LNP, namely ¼ or ¾ times the nozzle pitch HXP. In the example shown in FIG. 5, the position of the first reference nozzle 118R1 in the head 1142 is shifted in the positive direction of the X-axis direction (the right direction in FIG. 5) by ⅛ times the nozzle pitch LNP, namely 17.5 μm with respect to the position of the first reference nozzle 118R1 in the head 1143. However, the direction in which the head 1142 is shifted with respect to the head 1143 may be the negative direction of the X-axis direction in FIG. 5.

In the embodiment, the heads 1141, 1142, 1143, and 1144 are arranged in the negative direction of the Y-axis direction (downward in the figure) in this order. However, the order of these four heads arranged in the Y-axis direction is not limited to the order in the embodiment. Specifically, it may be acceptable that the head 1141 and also 1142 are adjacent in the Y-axis direction, and the head 1143 and 1144 are adjacent in the Y-axis direction.

As a result of the above-mentioned arrangement, each x-coordinate of the leftmost nozzles 118 in nozzle lines 2A, 3A, and 4A is positioned between the x-coordinate of the leftmost nozzle 118 in the nozzle line 1A and the x-coordinate of the leftmost nozzle 118 in the nozzle line 1B. Likewise, each x-coordinate of the leftmost nozzles 118 in nozzle lines 2B, 3B, and 4B is positioned between the x-coordinate of the leftmost nozzle 118 in the nozzle line 1B and the x-coordinate of the second nozzle 118 from the left in the nozzle line 1A. Similarly, each x-coordinate of the nozzles 118 in nozzle lines 2A or 2B, 3A or 3B, and 4A or 4B is positioned between the x-coordinate of another nozzle in the nozzle line 1A and the x-coordinate of another nozzle 118 in the nozzle line 1B.

More specifically, as a result of the above-mentioned head arrangement, the x-coordinate of the leftmost nozzle 118 in the nozzle line 1B substantially coincides with an intermediate position between the x-coordinate of the leftmost nozzle 118 in the nozzle line 1A and the x-coordinate of the second nozzle 118 from the left in the nozzle line 1A. Likewise, the x-coordinate of the leftmost nozzle 118 in the nozzle line 2A substantially coincides with an intermediate position between the x-coordinate of the leftmost nozzle 118 in the nozzle line 1A and the x-coordinate of the leftmost nozzle 118 in the nozzle line 1B. The x-coordinate of the leftmost nozzle 118 in the nozzle line 2B substantially coincides with an intermediate position between the x-coordinate of the second nozzle 118 from the left in the nozzle line 1A and the x-coordinate of the leftmost nozzle 118 in the nozzle line 1B. The x-coordinate of the leftmost nozzle 118 in the nozzle line 3A substantially coincides with an intermediate position between the x-coordinate of the leftmost nozzle 118 in the nozzle line 1A and the x-coordinate of the leftmost nozzle 118 from the left in the nozzle line 2A. The x-coordinate of the leftmost nozzle 118 in the nozzle line 3B substantially coincides with an intermediate position between the x-coordinate of the leftmost nozzle 118 in the nozzle line 1B and the x-coordinate of the leftmost nozzle 118 in the nozzle line 2B. The x-coordinate of the leftmost nozzle 118 in the nozzle line 4A substantially coincides with an intermediate position between the x-coordinate of the leftmost nozzle 118 in the nozzle line 1B and the x-coordinate of the leftmost nozzle 118 in the nozzle line 2A. The x-coordinate of the leftmost nozzle 118 in the nozzle line 4B substantially coincides with an intermediate position between the x-coordinate of the second nozzle 118 from the left in the nozzle line 1A and the x-coordinate of the leftmost nozzle 118 from the left in the nozzle line 2B.

The arrangement, namely configuration of the heads 1145, 1146, 1147, and 1148 in the head group 114G that is the second head group from the left in FIG. 5 is the same as that of the heads 1141, 1142, 1143, and 1144.

Next, the relative positional relationship between the two head groups 114G that are adjacent in the X-axis direction will be described base on the relative positional relationship between heads 1145 and 1141.

The position of the first reference nozzle 118R1 in the head 1145 is sifted in the positive direction of the X-axis direction from the position of the first reference nozzle 118R1 in the head 1141 by the length of the product of the nozzle pitch HXP in the X-axis direction in the head 114 and the number of ejection nozzles 118T in the head 114. In the embodiment, since the nozzle pitch HXP is approximately 70 μm and the number of ejection nozzles 118T in one head 114 is 160, the position of the first reference nozzle 118R1 in the head 1145 is sifted in the positive direction of the X-axis direction from the position of the first reference nozzle 118R1 in the head 1141 by 11.2 mm (70 μm×160). Here, in FIG. 8 and FIG. 9, since the number of ejection nozzles 118T in the head 114 is 8, the position of the first reference nozzle 118R1 in the head 1145 is illustrated as being shifted by 560 μm (70 μm×8) from the position of the first reference nozzle 118R1 in the head 1141.

Since the heads 1141 and 1145 are arranged as above-mentioned, the x-coordinate of the rightmost ejection nozzle 118T in the nozzle line 1A is shifted by the nozzle pitch LNP from the x-coordinate of the leftmost ejection nozzle 118T in the nozzle line 5A. Therefore, the nozzle pitch of the two head groups 114G in the X-axis direction, i.e., the distance between the x-coordinate of the rightmost ejection nozzle 118T in the nozzle line 4B and the x-coordinate of the leftmost ejection nozzle 118T in the nozzle line 5A is ¼ times the nozzle pitch HXP in the X-axis direction in the head 114.

In other head groups 114G in the ejection head part 103, the relative positional relationship among four heads 114 is the same relative positional relationship as mentioned above. Also, the relative positional relationship between two head groups that are adjacent in the X-axis direction is the same as that in two head groups mentioned above.

In addition, the nozzle 118T is distributed in a nozzle distribution range EXT (FIG. 4) such that the nozzle pitch in the X-axis direction is ¼ times the nozzle pitch HXP, namely 17.5 μm. Here, in the embodiment, "the nozzle distribution range EXT" is a range along the X-axis direction and defined with two ejection nozzles 118T that are located at the outermost in the ejection head part 103. These two ejection nozzles 118T that are located at the outermost are included in the nozzle distribution range EXT. Also, the length of a matrix that is formed with a plurality of parts to be ejected 18R on a base substrate 10A, which will be described later, in the X-axis direction is shorter than the length of the nozzle distribution range EXT.

D. Control Unit

Figure 6:
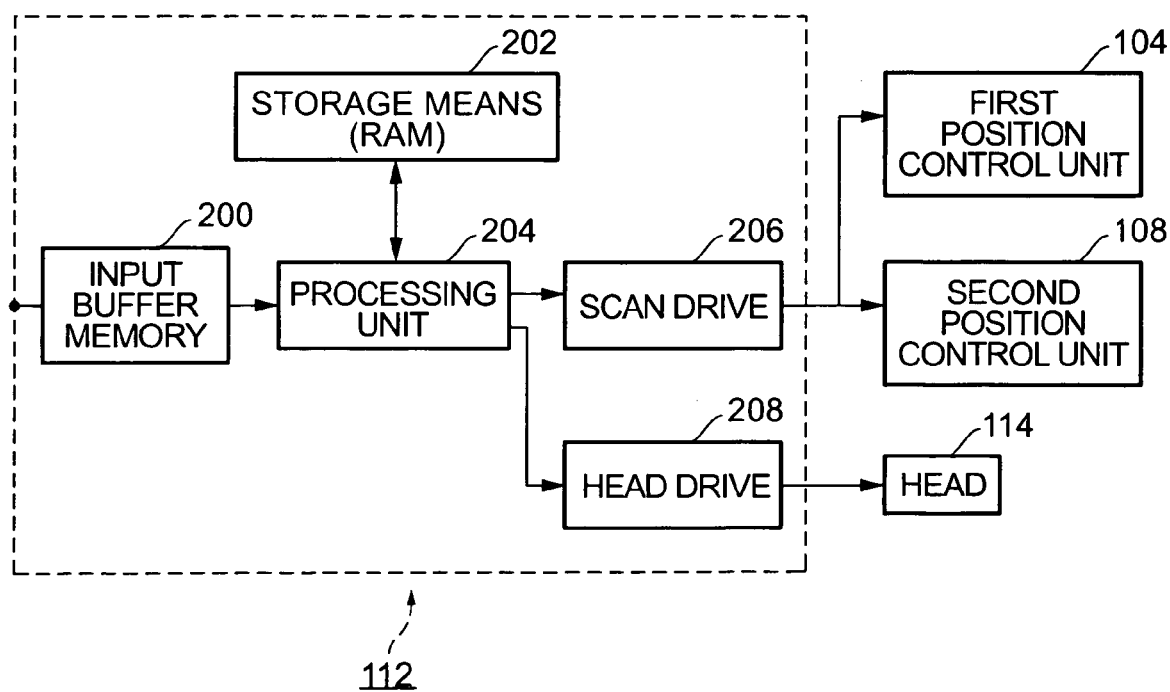
FIG. 6 is a function block diagram of a control unit in the ejection device of the first embodiment.

Next, a structure of the control unit 112 will be described. As shown in FIG. 6, the control unit 112 has an input buffer memory 200, a memory unit 202, a processing unit 204, a scan driver 206 and a head driver 208. The input buffer memory 200 and the processing unit 204 are coupled so as to communicate each other. The processing unit 204 and the memory unit 202 are coupled so as to communicate each other. The processing unit 204 and the scan driver 206 are coupled so as to communicate each other. The processing unit 204 and the head driver 208 are coupled so as to communicate each other. Also, the scan driver 206 is coupled to the first position control unit 104 and the second position control unit 108 so as to communicate each other. The head driver 208 is also coupled to each of heads 114 so as to communicate each other.

The input buffer memory 200 receives ejection data for ejecting the color filter material 111R from a host computer (not shown) located outside the ejecting unit 100R. The input buffer memory 200 provides the ejection data to the processing unit 204. The processing unit 204 stores the ejection data in the memory unit 202. In FIG. 6, the memory unit 202 is a random access memory (RAM). The ejecting unit 100R may include a computer functioning as an outside host computer in the control unit 112.

The processing unit 204 provides the scan driver 206 with data that shows a relative position of the nozzle 118 with respect to the part to be ejected, base on the ejection data in the memory unit 202. The scan driver 206 provides the second position control unit 108 with a driving signal in response to the data and an ejection period. As a result, the head 114 relatively scans the part to be ejected. In addition, the processing unit 204 provides each of heads 114 with an ejection signal necessary for ejecting the liquid color filter material 111R based on the ejection data stored in the memory unit 202. As the result, droplets D (FIG. 3) of the liquid color filter material 111R are ejected from each nozzle 118 of heads 114.

The control unit 112 may be a computer including a central processing unit (CPU), a read only memory (ROM) and a random access memory (RAM) and a bus. In this case, the above-described function of the control unit 112 is realized with a software program executed by the computer. If desired, the control unit 112 may be made up with a special circuit (hardware).

E. Color Filter Substrate

Figure 7A:
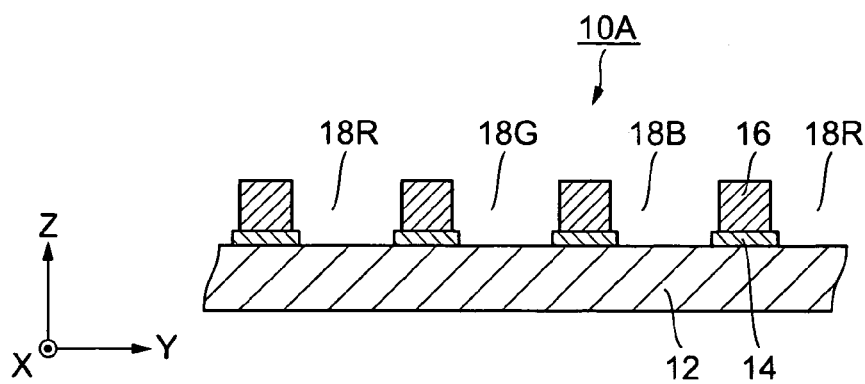
FIG. 7A is a schematic drawing illustrating a section of a base substrate of the first embodiment.

The base substrate 10A shown in FIGS. 7A and 7B serves as a color filter substrate 10 after processing in manufacturing equipment 1 that will be described in a second embodiment. The base substrate 10A includes a plurality of parts to be ejected 18R, 18G, and 18B that are arranged in a matrix.

Specifically, the base substrate 10A includes a support substrate 12 having light transparency, a black matrix 14 formed on the support substrate 12, and a bank 16 formed on the black matrix 14. The black matrix 14 is made of a material having light shielding. The black matrix 14 and the bank 16 on the black matrix 14 are arranged such that a plurality of light transparency parts, namely a plurality of pixel regions in a matrix form are defined on the support substrate 12.

Each concave part defined by the support substrate 12, the black matrix 14, and the in each of the pixel regions, corresponds to parts to be ejected 18R, 18G, and 18B. The part to be ejected 18R is the region in which a filter layer 111FR through which only light in a red wavelength range is transmitted is formed. The part to be ejected 18G is the region in which a filter layer 111FG through which only light in a green wavelength range is transmitted is formed. The part to be ejected 18B is the region in which a filter layer 111FB through which only light in a blue wavelength range is transmitted is formed.

Figure 7B:
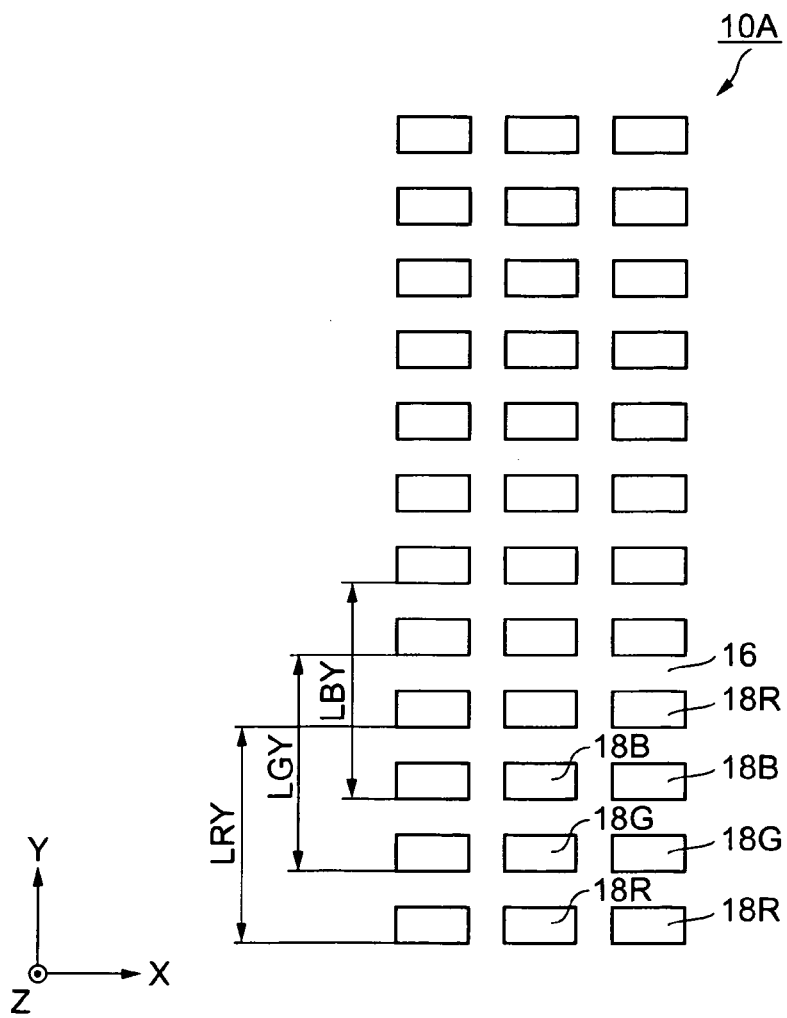
FIG. 7B is a schematic drawing illustrating an upper face of the base substrate of the first embodiment.

The base substrate 10A shown in FIG. 7B is located on a virtual plane parallel to both the X-axis direction and the Y-axis direction. The rows and the columns of the matrix that is formed of the plurality of the parts to be ejected 18R, 18G and 18B are parallel to the X-axis direction and the Y-axis direction respectively. In the base substrate 10A, the parts to be ejected 18R, 18G and 18B are periodically arranged in the Y-axis direction in this order. In contrast, the parts to be ejected 18R align in the X-axis direction at a predetermined fixed interval, the parts to be ejected 18G align in the X-axis direction at a predetermined fixed interval and the parts to be ejected 18B align in the X-axis direction at a predetermined fixed interval. Here, the X-axis direction and the Y-axis direction are orthogonal to each other.

An interval LRY between two parts to be ejected 18R along the Y-axis direction, namely a pitch is approximately 560 μm. The interval LRY is the same as an interval LGY between two parts to be ejected 18G along the Y-axis direction and an interval LBY between two parts to be ejected 18B along the Y-axis direction. The planar image of the part to be ejected 18R is a polygon defined by a long edge and short edge. Specifically, the length of the part to be ejected 18R in the Y-axis direction is approximately 100 μm and that in the X-direction is approximately 300 μm. The parts to be ejected 18G and 18B are the same shape and size as the part to be ejected 18R. The above-mentioned size of the parts to be ejected and the above-mentioned intervals between the parts to be ejected and correspond to the size of pixels and the interval between pixels corresponding to the same color in a high-vision television of approximately 40 inches.

F. Application Process

A process in which the liquid color filter material 111R is ejected to the part to be ejected 18R on the base substrate 10A using the ejection device 100R will be described below.

F1. Application Process to a First Base Substrate 10A

As shown in FIG. 8, the first base substrate 10A that includes the parts to be ejected 18R is provided on the stage 106. Specifically, the base substrate 10A is provided on the stage 106 such that the directions of rows and columns in the matrix formed by the plurality of parts to be ejected 18R are parallel to the X-axis direction and the Y-axis direction respectively. Further, in the case of this embodiment, the base substrate 10A is aligned on the stage 106 such that the long edge direction of each part to be ejected 18R is parallel to the X-axis direction and the short edge direction of each part to be ejected 18R is parallel to the Y-axis direction.

As shown in FIG. 8, a relative x-coordinate of the ejection head part 103 with respect to the stage 106 is kept at x1.

Here, "relative x-coordinate of the ejection head part 103 with respect to the stage 106" is defined as the x-coordinate in the internal coordinate system fixed to the stage 106. The directions of the X-axis, Y-axis, and Z-axis respectively correspond to the X-axis, Y-axis, and Z-axis direction that have been previously defined. Also, "relative x-coordinate of the ejection head part 103" is defined as a relative x-coordinate of a predetermined reference point in the ejection head part 103. For example, "relative x-coordinate of the ejection head part 103" may be described by the relative x-coordinate of the first reference nozzle 118R1 in a head 114.

In the case where the relative x-coordinate of the ejection head part 103 coincides with x1, at least one ejection nozzle 118T is located in an x-coordinate range of the part to be ejected 18R. Here, "x-coordinate range of the part to be ejected 18R" is defined the range from end to end of the part to be ejected 18R along the X-axis direction. In the embodiment, the length of "x-coordinate range of the part to be ejected 18R" is substantially equal to the length of the long edge of the part to be ejected 18R. In addition, in the embodiment, since the length of the x-coordinate range of the part to be ejected 18R is approximately 300 μm and the nozzle pitch GXP in the X-axis direction in the head 103 is approximately 17.5 μm, 16 ejection nozzles 118T correspond to a part to be ejected 18R. These 16 ejection nozzles 118T can be positioned at the region corresponding to the part to be ejected 18R (e.g. overlapped with the part to be ejected 18R) by changing the relative position of the ejection head part 103 with respect to the stage 106 in the Y-axis direction. However, 5 ejection nozzles 118T are used among 16 ejection nozzles 118T here for ejecting to the part to be ejected 18R.

Hereinafter, in the case where the relative x-coordinate of the ejection head part 103 is x1, the nozzle 118T for ejecting to the part to be ejected 18R is described as "the first nozzle".

Next, the relative position of the ejection head part 103 with respect to the stage 106 is changed to the positive direction of the Y-axis direction (the right direction in FIG. 9) with the second position control unit 108 driven by the control unit 112 while maintaining the relative x-coordinate of the ejection head part 103 to x1 as shown in FIG. 8. Accordingly, the head 103 relatively moves from one end to the other end of a scan field 134 shown in FIG. 33 only once. In the specification, a period in which the ejection head part 103 relatively moves from one end to the other end or the other end to the one end of the scan field only once is described as a "scan period" or a "one pass period".

Figure 33:
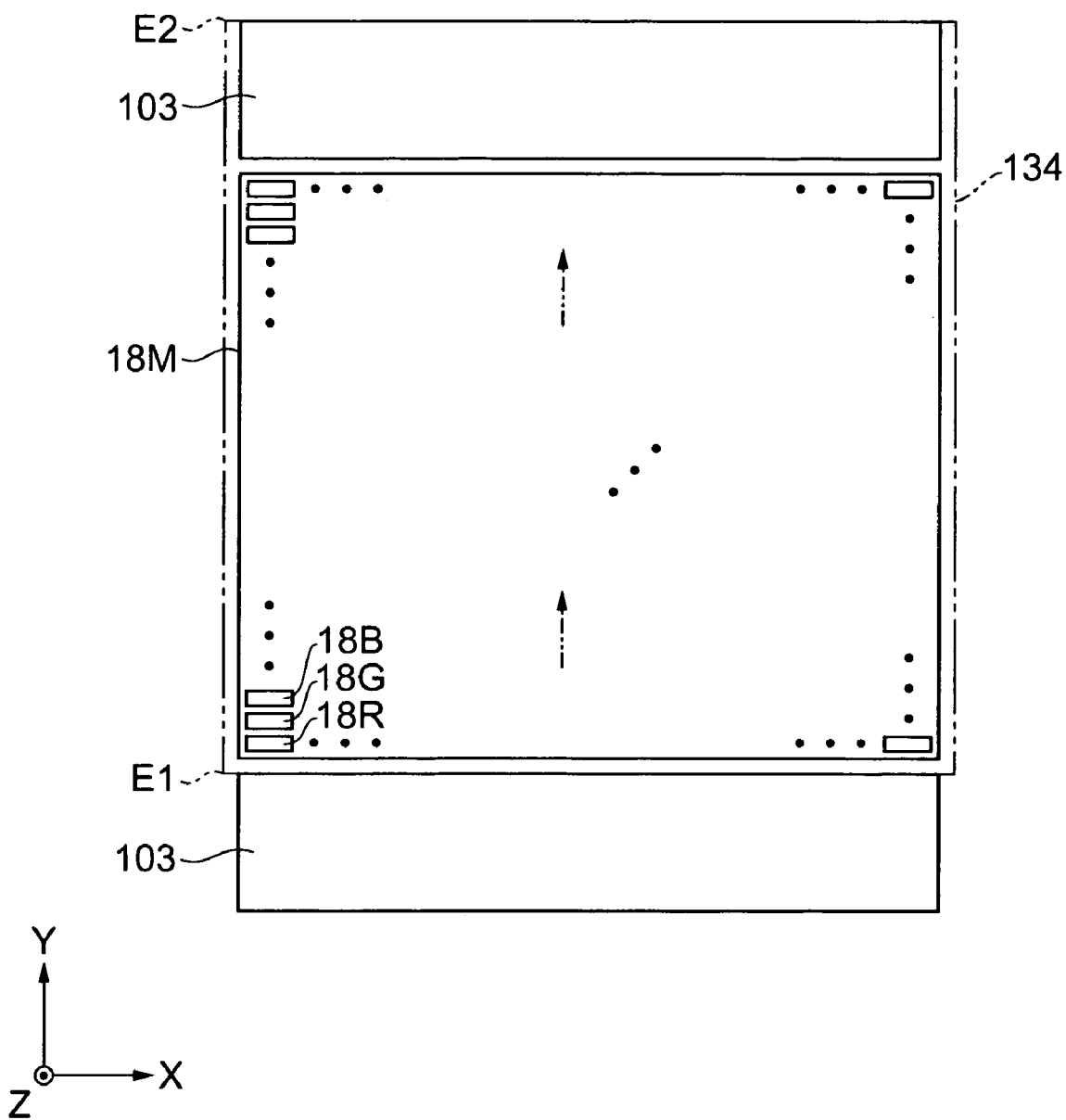
FIG. 33 is a schematic drawing explaining a scan field of embodiments 1 through 5.

Here, "the scan field 134", as shown in FIG. 33, is defined as the area in which one edge of the ejection head part 103 relatively moves with respect to the stage 106 for ejecting materials to all of the parts to be ejected 18R on the base substrate 10A. Therefore, the scan field 134 covers all of the parts to be ejected 18R. In the embodiment, the ejection head part 103 moves across the entire scan field 134 within one scan period.

In some cases, the word "scan field" can refer to an area where one nozzle 118 (FIG. 2) relatively moves with respect to the stage 106, an area where one nozzle line 116A (or 116B) (FIG. 2) relatively moves with respect to the stage 106, or an area where one head 114 (FIG. 2) relatively moves with respect to the stage 106.

In addition, the relative movements of the ejection head part 103, the head group 114G (FIG. 4), the head 114 (FIG. 2), or the nozzle 118 (FIG. 2) with respect to the stage 106 mean that these relative positions are changed with respect to the stage 106, the base substrate 10A, or the part to be ejected 18R. Therefore, in the specification, even though the case where only the stage 106 moves while the ejection head part 103, the head group 114G, the head 114, or the nozzles 118 remain stationary with respect to the ejection device 100R, it is described that the ejection head part 103, the head group 114G, the head 114, or the nozzles 118 relatively move with respect to the stage 106, the base substrate 10A, or the part to be ejected 18R. Also, a combination of the relative scan or relative move, and the ejection of the material may be referred as "application and scanning."

In the case where 5 ejection nozzles 118T (the first nozzle) are positioned at the region corresponding to the parts to be ejected 18R by the relative movement of the ejection head part 103 in the positive direction of the Y-axis direction, the ejection head part 103 ejects the droplets D (FIG. 3) of the liquid color filter material 111R to the parts to be ejected 18R from these 5 ejection nozzles 118T (the first nozzle). In this way, the ejection device 100R ejects the droplets D of the liquid color filter material 111R to each of the plurality of parts to be ejected 18R arranged in the Y-axis direction.

Next, as shown in FIG. 9, the control unit 112 changes the relative position of the ejection head part 103 with respect to the stage 106 in the X-axis direction with the first position control unit 104 such that the relative x-coordinate of the ejection head part 103 with respect to the stage 106 coincides with x2. Specifically, the ejection head part 103, accordingly, moves relatively with respect to the stage 106 in the positive direction of the X-axis direction by the distance of approximately 30 nozzles. In the embodiment, the distance of approximately 30 nozzles is about 507.5 μm (17.5×(30−1)).

In the case where the relative x-coordinate of the ejection head part 103 with respect to the stage 106 coincides with x2, at least one ejection nozzle 118T is located in the x-coordinate range of the part to be ejected 18R. In the embodiment, 16 ejection nozzles 118T correspond to one part to be ejected 18R. These 4 ejection nozzles 118T can be positioned at the region corresponding to the part to be ejected 18R (e.g. overlapped with the part to be ejected 18R) by changing the relative position of the ejection head part 103 with respect to the stage 106 in the Y-axis direction. However, 4 ejection nozzles 118T are used among 16 ejection nozzles 118T for ejecting to the part to be ejected 18R.

Hereinafter, in the case where the relative x-coordinate of the ejection head part 103 is x2, the nozzle 118T for ejecting to the part to be ejected 18R is described as "the second nozzle".

Next, the relative position of the ejection head part 103 with respect to the stage 106 is changed to the negative direction of the Y-axis direction (the left direction in FIG. 9) with the second position control unit 108 driven by the control unit 112 while maintaining the relative x-coordinate of the ejection head part 103 to x2 as shown in FIG. 9. Accordingly, the head 103 relatively moves from the other end to the one end of the scanning field only once.

In the case where 4 ejection nozzles 118T (the second nozzle) are positioned at the region corresponding to the parts to be ejected 18R by the relative movement of the ejection head part 103 in the negative direction of the Y-axis direction, the ejection head part 103 ejects the droplets D (FIG. 3) of the liquid color filter material 111R to the parts to be ejected 18R from these 4 ejection nozzles 118T (the second nozzle). In this way, the ejection device 100R ejects the droplets D of the liquid color filter material 111R to each of the plurality of parts to be ejected 18R arranged in the Y-axis direction.

In the first scan period and second scan period, the droplets D of the color filter material 111R are ejected to each of the plurality of parts to be ejected 18R in the first base substrate 10A from different ejection nozzles 118T, respectively. Specifically, in the first scan period, the droplets D are ejected from the first 5 nozzles and in the second scan period, the droplets D are ejected from the second 4 nozzles. In this way, the droplets D are ejected from a total of 9 ejection nozzles 118T to one part to be ejected. As a result, a predetermined volume of the color filter material 111R is applied to each part to be ejected 18R. Since the ejection nozzle 118T used for ejecting to each of the plurality of parts to be ejected 18R is different in the first scan period and the second scan period, differences in ejected volume among the ejection nozzles 118T are less exhibited among the color filter material 111R applied to the parts to be ejected 18R, even though the ejecting volume of the droplet D differs among the ejection nozzles 118T due to manufacturing errors in the head 114.

In this way, the ejection device 100R applies the liquid color filter material 111R to all of the parts to be ejected 18R in the first base substrate 10A during two scan periods.

After the ejection device 100R completes application processes to the first base substrate 10A, a transfer device 170 removes the first base substrate 10A from the stage 106 using a fork part. The relative x-coordinate of the ejection head part 103 is kept at x2 until the first scan period is started to the second base substrate 10A after the completion of the second scan period to the first base substrate 10A.

F2. Application Process to the Second Base Substrate 10A

Figure 10:
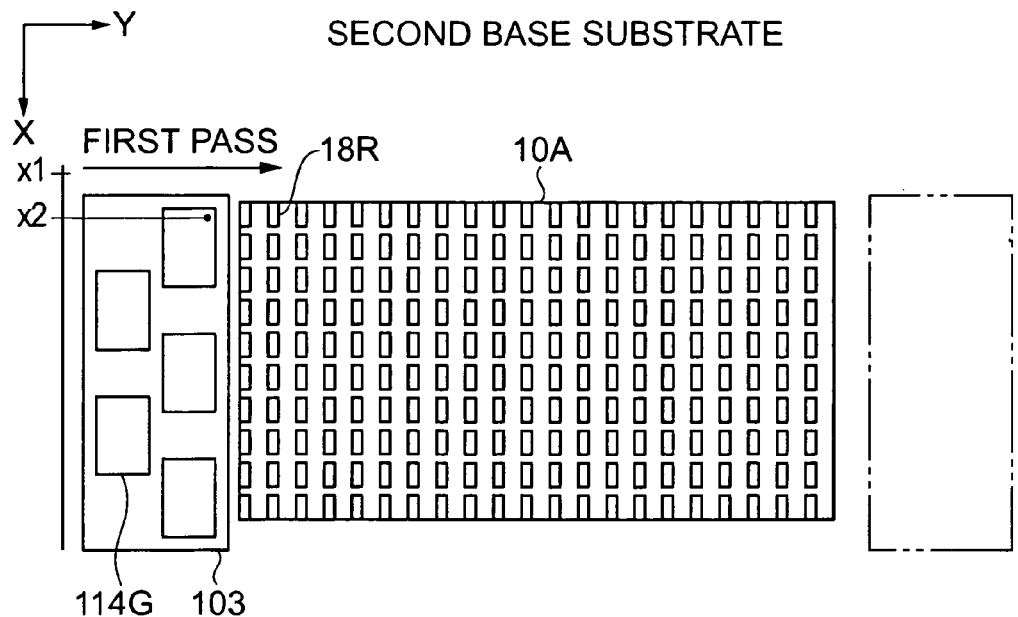
FIG. 10 is a schematic drawing illustrating an application process of the first embodiment, in which a first scan period for a second base substrate is schematically illustrated.

The construction of the second base substrate 10A is the same as that of the first base substrate 10A. First, as shown in FIG. 10, the second base substrate 10A is provided on the stage 106. Specifically, the second base substrate 10A is aligned on the stage 106 such that the relative position of the second base substrate 10A with respect to the stage 106 is the same as the relative position of the first base substrate 10A with respect to the stage 106. Here, since the relative x-coordinate of the ejection head part 103 with respect to the stage 106 is kept at x2, 16 ejection nozzles 118T are located in each x-coordinate range of the parts to be ejected 18R. However, 4 ejection nozzles 118T described above, namely the second 4 nozzles are used among 16 ejection nozzles 118T for ejecting to the part to be ejected 18R.

Next, the relative position of the ejection head part 103 with respect to the stage 106 is changed to the positive direction of the Y-axis direction (the right direction in FIG. 10) with the second position control unit 108 driven by the control unit 112 while maintaining the relative x-coordinate of the ejection head part 103 to x2 as shown in FIG. 10. Accordingly, the head 103 relatively moves from one end to the other end of the scanning field only once.

In the case where 4 ejection nozzles 118T (the second nozzle) are positioned at the region corresponding to the parts to be ejected 18R by the relative movement of the ejection head part 103 in the negative direction of the Y-axis direction, the ejection head part 103 ejects the droplets D (FIG. 3) of the liquid color filter material 111R to the parts to be ejected 18R from these 4 ejection nozzles 118T (the second nozzle). In this way, the ejection device 100R ejects the droplets D of the liquid color filter material 111R to each of the plurality of parts to be ejected 18R arranged in the Y-axis direction.

Figure 11:
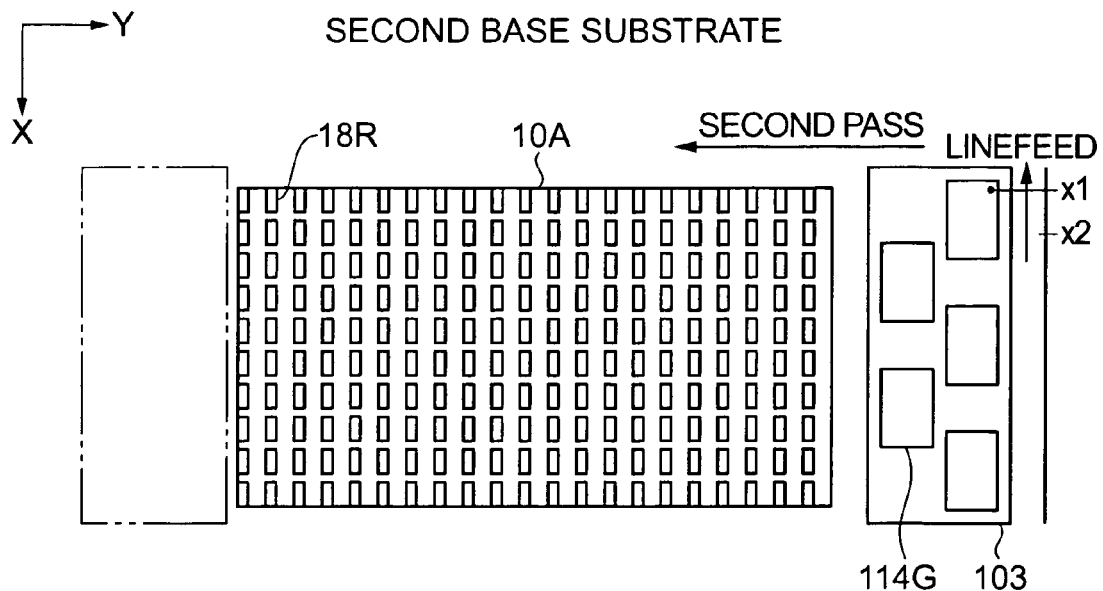
FIG. 11 is a schematic drawing illustrating an application process of the first embodiment, in which a second scan period for the second base substrate is schematically illustrated.

Next, as shown in FIG. 11, the control unit 112 changes the relative position of the ejection head part 103 with respect to the stage 106 in the X-axis direction with the first position control unit 104 such that the relative x-coordinate of the ejection head part 103 with respect to the stage 106 is changed to x1 from x2. Accordingly, the ejection head part 103 moves relatively with respect to the stage 106 in the negative direction of the X-axis direction by the distance of approximately 30 nozzles. As described above, in the embodiment, the distance of approximately 30 nozzles is about 507.5 μm (17.5×(30−1)).

In the case where the relative x-coordinate of the ejection head part 103 with respect to the stage 106 coincides with x1, at least one ejection nozzle 118T is located in the x-coordinate range of the part to be ejected 18R. In the embodiment, 16 ejection nozzles 118T are positioned to one part to be ejected 18R. However, 5 ejection nozzles 118T described above, namely the first 5 nozzles are used among 16 ejection nozzles 118T for ejecting to the part to be ejected 18R.

Next, the relative position of the ejection head part 103 with respect to the stage 106 is changed to the negative direction of the Y-axis direction (the left direction in FIG. 11) with the second position control unit 108 driven by the control unit 112 while maintaining the relative x-coordinate of the ejection head part 103 to x1 as shown in FIG. 11. Accordingly, the head 103 relatively moves from the other end to the one end of the scanning field only once.

In the case where 5 ejection nozzles 118T (the first nozzle) are positioned at the region corresponding to the parts to be ejected 18R by the relative movement of the ejection head part 103 in the negative direction of the Y-axis direction, the ejection head part 103 ejects the droplets D (FIG. 3) of the liquid color filter material 111R to the parts to be ejected 18R from these 5 ejection nozzles 118T (the first nozzle). In this way, the ejection device 100R ejects the droplets D of the liquid color filter material 111R to each of the plurality of parts to be ejected 18R arranged in the Y-axis direction.

In the first scan period and second scan period, the droplets D of the color filter material 111R are ejected to each of the plurality of parts to be ejected 18R in the second base substrate 10A from different ejection nozzles, respectively. Specifically, in the first scan period, the droplets D are ejected from the second 4 nozzles and in the second scan period, the droplets D are ejected from the first 5 nozzles. In this way, the droplets D are ejected from total 9 ejection nozzles 118T to one part to be ejected 18R. As the result, a predetermined volume of the color filter material 111R is applied to each part to be ejected 18R. According to the embodiment, since the ejection nozzle 118T used for ejecting to each of the plurality of parts to be ejected 18R is different in the first scan period and the second scan period, differences in ejected volume among the ejection nozzles 118T are less exhibited among the color filter material 111R applied to the parts to be ejected 18R, even though the ejecting volume of the droplet D differs among the ejection nozzles 118T due to manufacturing errors in the head 114.

Modifications of the First Embodiment (1) In the above-mentioned embodiment, the ejection nozzle 118T that ejects the color filter material 111R to the first base substrate 10A in the second scan period is the same as the ejection nozzle 118T that ejects the color filter material 111R to the second base substrate 10A in the first scan period. However, the present invention is not limited to this construction. As described below, the ejection nozzle 118T that ejects the color filter material 111R to the first base substrate 10A in the second scan period may be different from the ejection nozzle 118T that ejects the color filter material 111R to the second base substrate 10A in the first scan period.

In FIGS. 12 through 15, each ejection nozzle 118T in one head group 114G is described as nozzles N1, N2, N3,-N64 in the small order of x-coordinate.

Figure 12:
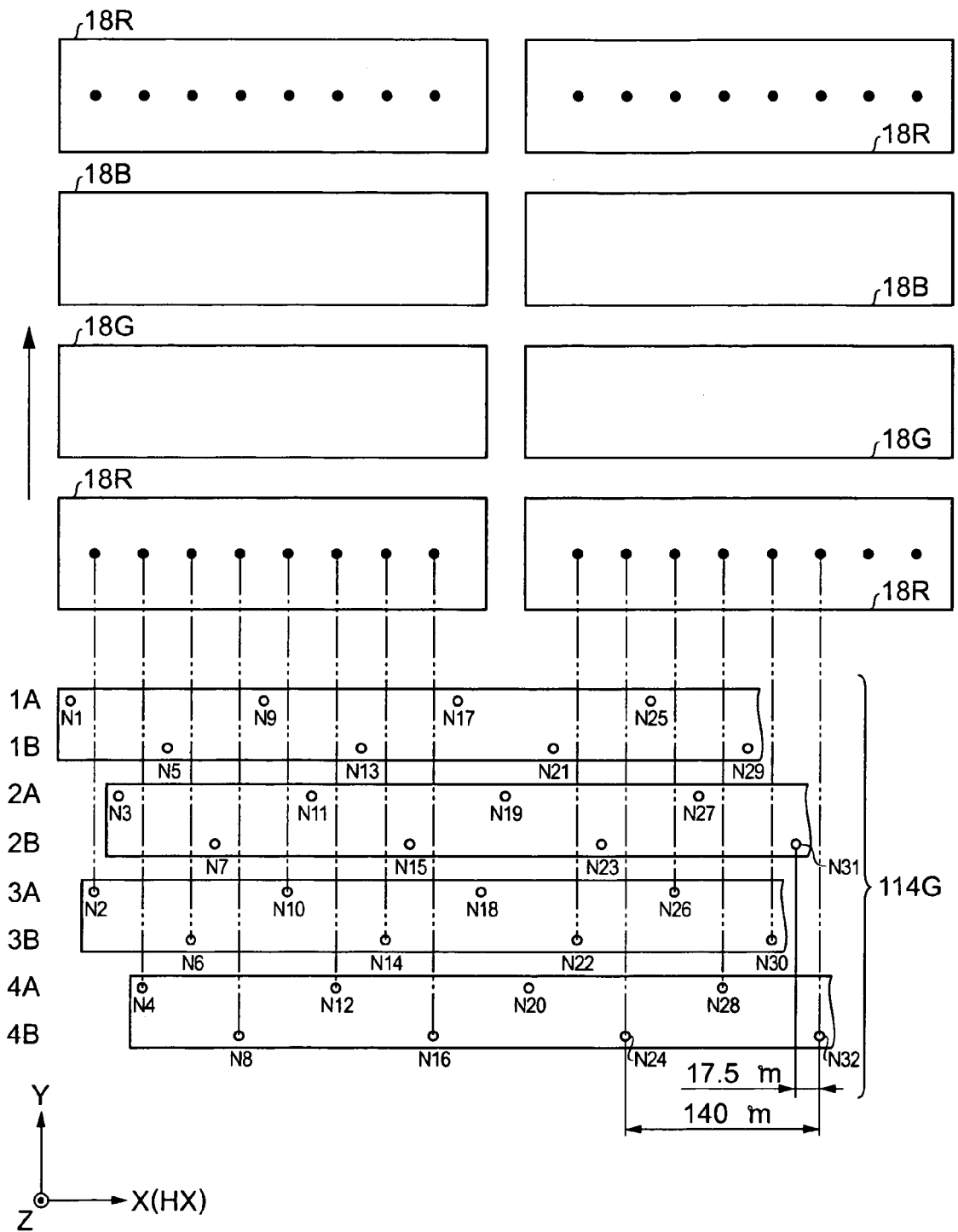
FIG. 12 is a schematic drawing illustrating a modification of an application process of the first embodiment, in which a first scan period for a first base substrate is schematically illustrated.

First, the control unit 112 sets the relative x-coordinate of the ejection head part 103 to x1. Accordingly, for example, 16 ejecting nozzles 118T, namely nozzles N2 through N17 are positioned in the x-coordinate range of the part to be ejected 18R located at the lower left corner in FIG. 12. Then, the control unit 112 starts the first scan period to the first base substrate 10A after setting the relative x-coordinate of the ejection head part 103 to x1. During the first scan period to the first base substrate 10A, the droplets D of the color filter material 111R are ejected to the part to be ejected 18R from 8 ejection nozzles 118T, i.e., N2, N4, N6-N16, among 16 ejection nozzles 118T, i.e., N2 through N17. Here, each of nozzles N2, N4, N6,-N16 in FIG. 12 corresponds to the first nozzle of the present invention. A filled circle in FIG. 12 illustrates the position to which the droplet D from the first nozzle is landed.

Figure 13:
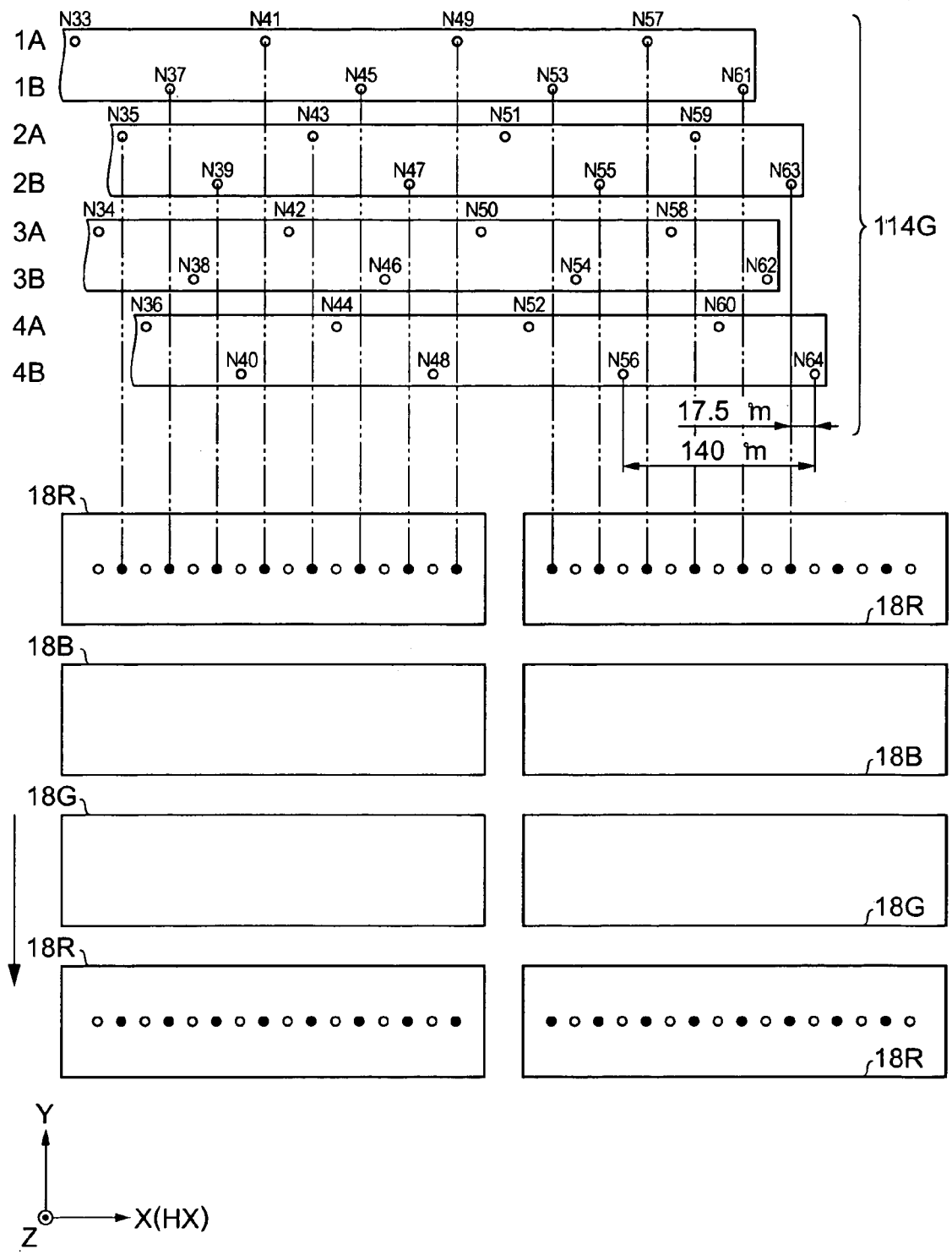
FIG. 13 is a schematic drawing illustrating a modification of an application process of the first embodiment, in which a second scan period for the first base substrate is schematically illustrated.

Next, the control unit 112 sets the relative x-coordinate of the ejection head part 103 to x2. In the embodiment, x1 is larger than x2 (x1>x2) in order to simplify the explanation. Also, the distance between the relative x-coordinates x1 and x2 corresponds to the distance of 32 nozzles. That is, if the relative x-coordinate of the ejection head part 103 is set to x2, the nozzle N33 is set to the position where the nozzle N1 has been located. If the control unit 112 sets the relative x-coordinate of the ejection head part 103 to x2, 16 ejection nozzles 118T, i.e., nozzles N34 through N49 are positioned in the x-coordinate range of the part to be ejected 18R located at the upper left corner in FIG. 13. Here, the parts to be ejected 18R located at the upper and lower left corner in FIG. 13 are the same as the parts to be ejected 18R located at the upper and lower left corner in FIG. 12.

Then, the control unit 112 starts the second scan period to the first base substrate 10A after setting the relative x-coordinate of the ejection head part 103 to x2. As shown in FIG. 13, during the second scan period to the first base substrate 10A, the droplets D of the color filter material 111R are ejected to the part to be ejected 18R from 8 ejection nozzles 118T, i.e., N35, N37, N39-N49, among 16 ejection nozzles 118T, i.e., N34 through N49. Here, each of nozzles N35, N37, N39,-N49 in FIG. 13 corresponds to the second nozzle of the present invention. A Filled circle in FIG. 13 illustrates the position to which the droplet D from the second nozzle is landed. An open circle in FIG. 13 illustrates the position to which the droplet D from the first nozzle is landed for comparison.

Next, the second base substrate 10A is provided on the stage 106 after removing the first base substrate 10A provided on the stage 106. The relative position of the second base substrate 10A with respect to the stage 106 is the same as the relative position of the first base substrate 10A with respect to the stage 106. Also, the relative x-coordinate of the ejection head part 103 is still maintained to x2. In this case, 16 ejection nozzles 118T, i.e., nozzles N34 through N49 are positioned in the x-coordinate range of the parts to be ejected 18R located at the lower left corner in FIG. 14.

Figure 14:
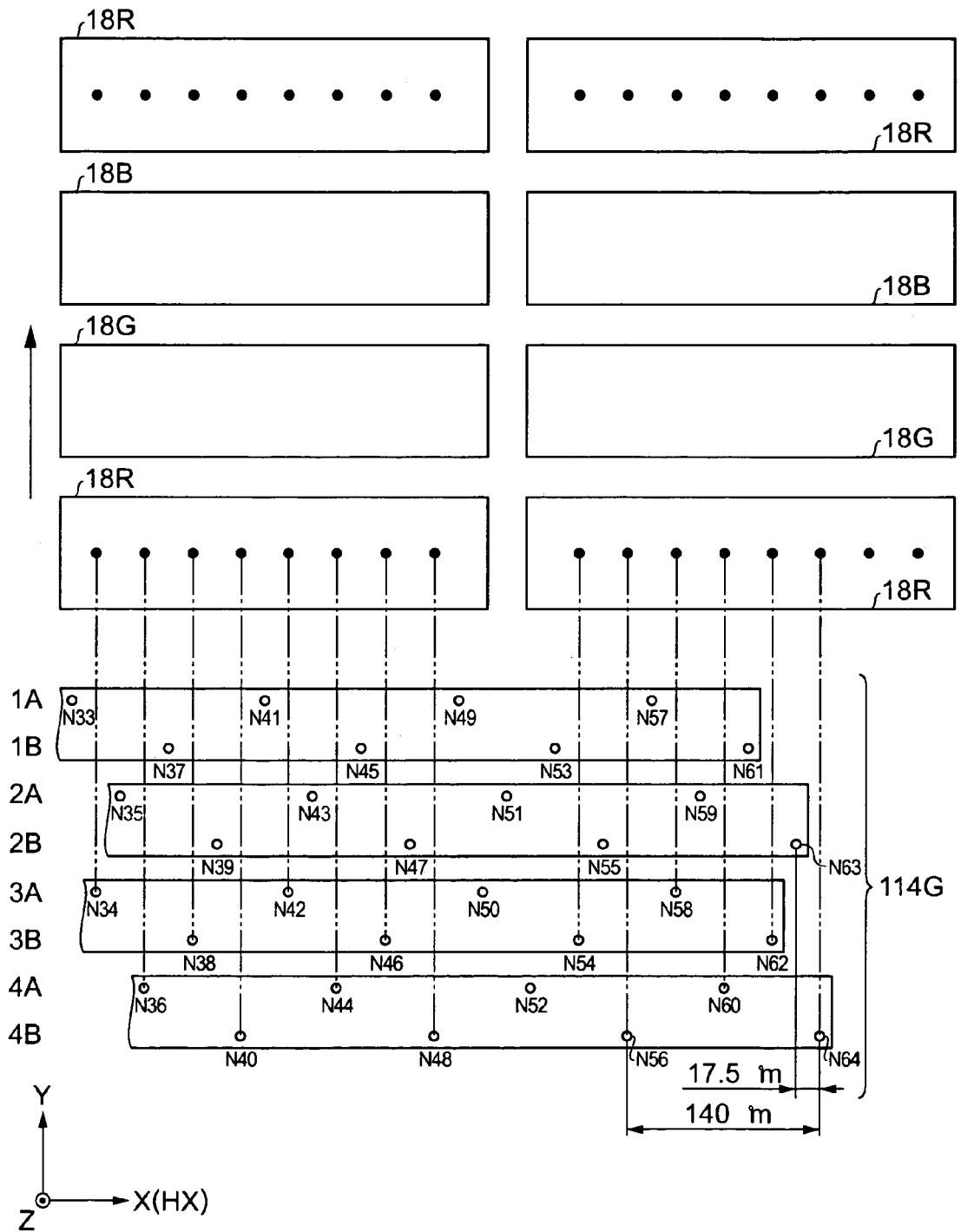
FIG. 14 is a schematic drawing illustrating a modification of an application process of the first embodiment, in which a first scan period for a second base substrate is schematically illustrated.

Upon setting of the second base substrate 10A, the control unit 112 starts the first scan period to the second base substrate 10A. As shown in FIG. 14, during the first scan period to the second base substrate 10A, the droplets D of the color filter material 111R are ejected to the part to be ejected 18R from 8 ejection nozzles 118T, i.e., N34, N36, N38-N48, among 16 ejection nozzles 118T, i.e., N34 through N49. Here, each of nozzles N34, N36, N38,-N48 in FIG. 14 corresponds to the third nozzle of the present invention. A filled circle in FIG. 14 illustrates the position to which the droplet D from the third nozzle is landed.

The control unit 112 sets the relative x-coordinate of the ejection head part 103 to x1. Accordingly, 16 ejection nozzles, i.e., nozzles N2 through N17 are positioned in the x-coordinate range of the parts to be ejected 18R located at the upper left corner in FIG. 15.

Figure 15:
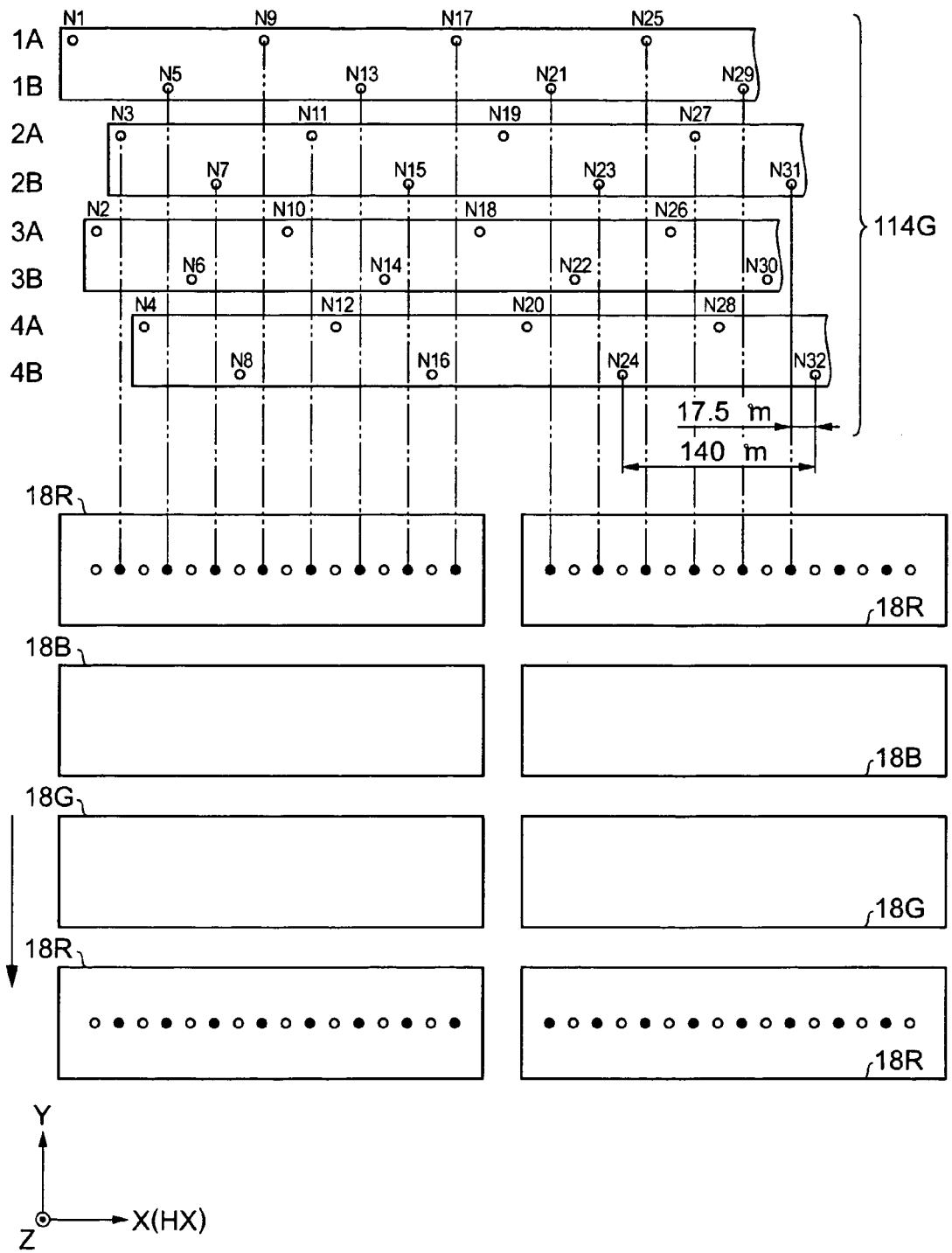
FIG. 15 is a schematic drawing illustrating a modification of an application process of the first embodiment, in which a second scan period for the second base substrate is schematically illustrated.

Then, the control unit 112 starts the second scan period to the second base substrate 10A after setting the relative x-coordinate of the ejection head part 103 to x1. As shown in FIG. 15, during the second scan period to the second base substrate 10A, the droplets D of the color filter material 111R are ejected to the part to be ejected 18R from 8 ejection nozzles 118T, i.e., N3, N5, N7-N17, among 16 ejection nozzles 118T, i.e., N2 through N17. Here, each of nozzles N3, N5, N7,-N17 in FIG. 15 corresponds to the fourth nozzle of the present invention. A filled circle in FIG. 15 illustrates the position to which the droplet D from the fourth nozzle is landed. An open circle in FIG. 15 illustrates the position to which the droplet D from the third nozzle is landed for comparison.

As described in the modification, for each part to be ejected 18R, the nozzle that performs ejecting to the first base substrate 10A in the second scan period is different from the nozzle that performs ejecting to the second base substrate 10A in the first scan period. That is, the second nozzle is different from the third nozzle. In contrast, the second nozzle is the same as the third nozzle in the first embodiment.

(2) In the above-mentioned embodiments, the ejection device 100R conducts the application and scanning to one base substrate 10A over the period of two passes (scan periods). However, the pass can be conducted several times, if the number of passes (scan periods) is even. If the number of passes (scan periods) is even, the material 111R can be sequentially and efficiently supplied to each of the plurality of base substrates 10A.

Second Embodiment

In the first embodiment, processes that apply the color filter material 111R to parts to be ejected 18R have been described. Hereinafter, a series of processes in which the color filter substrate 10 is manufactured by the manufacturing equipment 1 will be described.

Figure 16:
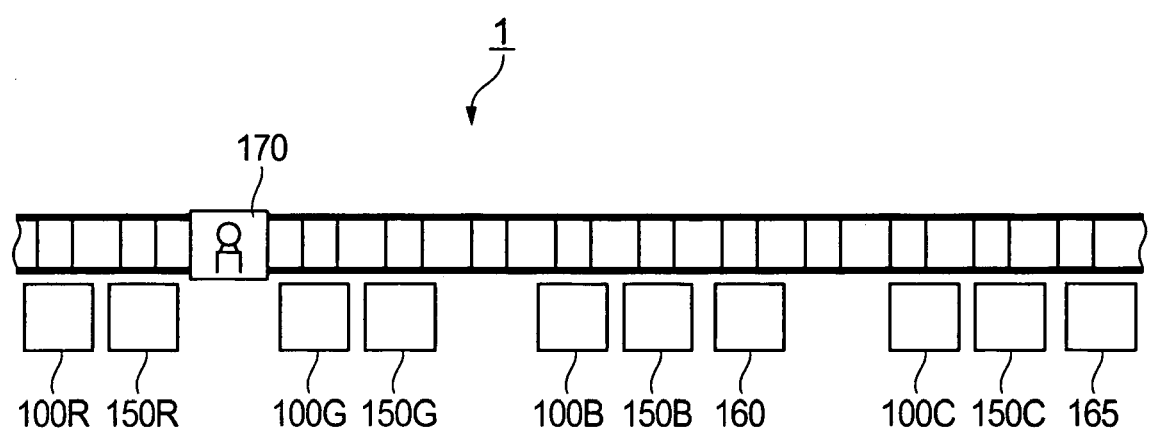
FIG. 16 is a schematic drawing illustrating manufacturing equipment of a color filter substrate of a second embodiment of the present invention.

Manufacturing equipment 1 shown in FIG. 16 is equipment to eject a correspondent color filter material to each of parts to be ejected 18R, 18G and 18B of the base substrate 10A shown in FIG. 7. Specifically, the manufacturing equipment 1 has the ejection device 100R that applies the color filter material 111R to all of the parts to be ejected 18R and a drying device 150R that dries the color filter material 111R on the parts to be ejected 18R. The manufacturing equipment 1 also has an ejection device 100G that applies a color filter material 111G to all of the parts to be ejected 18G, a drying device 150G that dries the color filter material 111G on the parts to be ejected 18G, an ejection device 100B that applies a color filter material 111B to all of the parts to be ejected 18B and a drying device 150B that dries the color filter material 111B on the parts to be ejected 18B. The manufacturing equipment 1 further has an oven 160 in which the color filter materials 111R, 111G and 111B are reheated (post-bake), an ejection device 100C to form a protection film layer 20 on a layer of post-baked color filter materials 111R, 111G and 111B, a drying device 150C that dries the protection film layer 20 and a curing device 165 that heats the dried protection film layer 20 again and hardens it. Further, the manufacturing equipment 1 includes the transfer device 170 that carries the base substrate 10A to the ejection device 100R, the drying device 150R, the ejection device 100G, the drying device 150G, the ejection device 100B, the drying device 150B, the ejection device 100C, the drying device 150C and the curing device 165, in this order. The transfer device 170 is equipped with a fork unit, a driver to move the fork unit up and down, and a self-traveling unit.

The construction of the ejection device 100R has been described in the first embodiment, thus, the explanation will be omitted. The structure of the ejection device 100G, the structure of the ejection device 100B and the structure of the ejection device 100C are essentially same as that of the ejection device 100R. However, the construction of the ejection device 100G differs from that of the ejection device 100R in that it has a tank and a tube for the color filter material 111G instead of the tank 101R and tube 110R in the ejection device 100R. Likewise, the construction of the ejection device 100B differs from that of the ejection device 100R in that it has a tank and a tube for the color filter material 111B instead of the tank 101R and the tube 110R. Also, the construction of the ejection device 100C differs from that of the ejection device 100R in that it has a tank and a tube for a protection film material instead of the tank 101R and the tube 110R. Each of liquid color filter materials 111R, 111G, and 111B of the embodiment is an example of "a liquid material" of the present invention.

First, the base substrate 10A in FIG. 7 will be formed by the following procedures. First, metal thin film is formed on the supporting substrate 12 by sputtering or vapor deposition method. Then, the black matrix 14 is formed as a lattice-shaped from the metal thin film by photolithography. Chromium metal and chromium oxide are exemplified as materials for the black matrix 14. The supporting substrate 12 is one that has transparency to visible light, for example, a glass substrate. Then, a resist layer made of a negative-type photosensitive resin composition is applied so as to cover the supporting substrate 12 and the black matrix 14. Next, the resist layer is exposed while closely contacting mask film that is formed as a matrix pattern on the resist layer. Subsequently, the bank 16 is obtained by removing unexposed parts on the resist layer with etching. According to the processes described above, the base substrate 10A is obtained.

Alternatively, the bank made of a resin black may be used instead of the bank 16. In this case, bank layer includes only one layer without the metal thin film (black matrix 14).

Next, lyophilicity is given to the base substrate 10A by oxygen plasma treatment under the atmospheric pressure. By the treatment, the surface of the supporting substrate 12, the surface of the black matrix 14, and the surface of the bank 16 in each concave part defined by the supporting substrate 12, the black matrix 14, and the bank 16 (a part of the pixel region) exhibit lyophilicity. Additionally, the base substrate 10A is subjected to a plasma treatment in which tetrafluoromethane is used as treatment gas. With the plasma treatment using tetrafluoromethane, the surface of the bank 16 in each concave part is fluorinated (lyophobicity is given). Thus, the surface of the bank 16 exhibits lyophobicity. With the plasma treatment using tetrafluoromethane, the surface of the supporting substrate 12 and the surface of the black matrix 14 both of which lyophilicity has been given to lose lyophilicity somewhat. However, these surfaces still maintain sufficient lyophilicity. In this way, by performing predetermined surface treatments to the surface of the concave part defined by the supporting substrate 12, the black matrix 14, and the bank 16, the surface of the concave part serves the parts to be ejected 18R, 18G, and 18B.

Depending on materials of the supporting substrate 12, the black matrix 14, and the bank 16, the surface that exhibits desired lyophilicity and lyophobicity can be obtained without the above-mentioned treatments. In such a case, the surface of each concave part defined by the supporting substrate 12, the black matrix 14, and the bank 16 serves the parts to be ejected 18R, 18G, and 18B without the above-mentioned treatments.

Figure 17A:
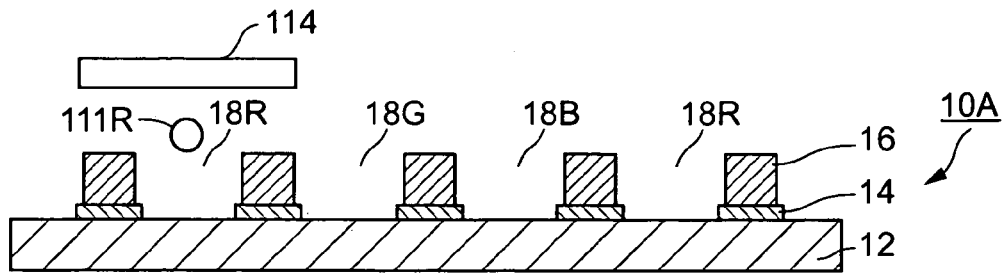
FIGS. 17A-17D are drawings explaining a method of manufacturing a color filter substrate of the second embodiment.

The base substrate 10A on which the parts to be ejected 18R, 18G and 18B are formed is carried by the transfer device 170 to the stage 106 of the ejection device 100R. Then, as shown in FIG. 17A, the ejection device 100R ejects the color filter material 111R from the head 114 in accordance with ejection data so as to form the layer of the color filter material 111R on all of the parts to be ejected 18R. More specifically, the ejection device 100R applies the color filter material 111R to each part to be ejected 18R by performing the application processes in the first embodiment.

After the layer of the color filter material 111R is formed on all of the parts to be ejected 18R of the base substrate 10A, the transfer device 170 puts the base substrate 10A in the drying device 150R. Then, a filter layer 111FR is obtained on the parts to be ejected 18R by completely drying the color filter material 111R on the parts to be ejected 18R.

Figure 17B:
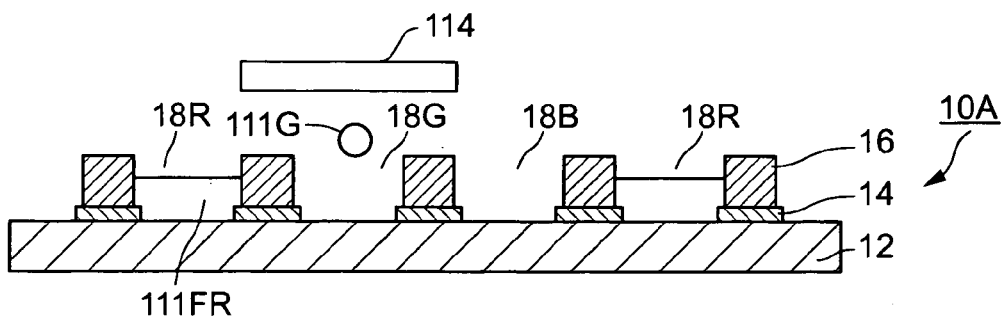

Next, the transfer device 170 puts the base substrate 10A on the stage 106 of the ejection device 100G. Then, as shown in FIG. 17B, the ejection device 100G ejects the color filter material 111G from the head 114 in accordance with ejection data that corresponds to the part to be ejected 18G so as to form the layer of the color filter material 111G on all of the parts to be ejected 18G. More specifically, the ejection device 100G applies the color filter material 111G to each part to be ejected 18G by performing the application processes in the first embodiment.

After the layer of the color filter material 11G is formed on all of the parts to be ejected 18G of the base substrate 10A, the transfer device 170 puts the base substrate 10A in the drying device 150G. Then, a filter layer 111FG is obtained on the parts to be ejected 18G by completely drying the color filter material 111G on the parts to be ejected 18G.

Figure 17C:
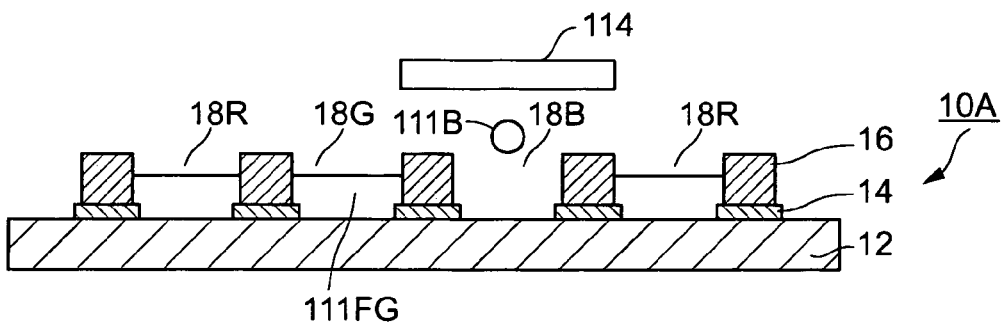
Figure 17D:
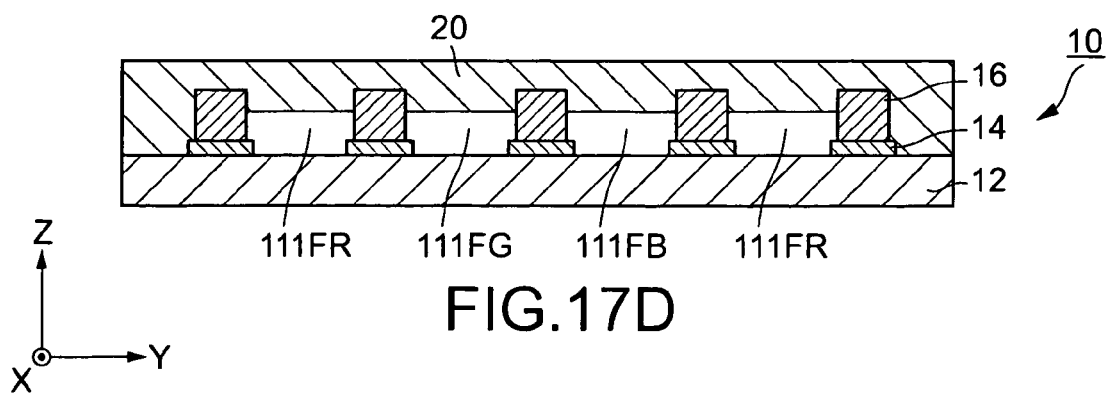

Next, the transfer device 170 puts the base substrate 10A on the stage 106 of the ejection device 100B. Then, as shown in FIG. 17C, the ejection device 100B ejects the color filter material 111B from the head 114 in accordance with ejection data that corresponds to the part to be ejected 18B so as to form the layer of the color filter material 111B on all of the parts to be ejected 18B. More specifically, the ejection device 100B applies the color filter material 111B to each part to be ejected 18B by performing the application processes in the first embodiment.

After the layer of the color filter material 111B is formed on all of the parts to be ejected 18B of the base substrate 10A, the transfer device 170 puts the base substrate 10A in the drying device 150B. Then, a filter layer 111FB is obtained on the parts to be ejected 18B by completely drying the color filter material 111B on the parts to be ejected 18B.

Next, the transfer device 170 puts the base substrate 10A in the oven 160. Then, the filter layers 111FR, 111FG and 111FB are heated again (post-bake) in the oven 160.

Next, the transfer device 170 puts the base substrate 10A on the stage 106 of the ejection device 100C. Then, the ejection device 100C ejects the liquid protection film material so as to form the protection film layer 20 covering the filter layers 111FR, 111FG and 111FB and the bank 16. After the protection film layer 20 that covers the filter layers 111FR, 111FG and 111FB and the bank 16 is formed, the transfer device 170 puts the base substrate 10A in the oven 150C. Then the protection film layer 20 is completely dried in the oven 150C, and then the curing device 165 heats the protection film layer 20 for complete curing. As the result, the base substrate 10A serves as the color filter substrate 10.

Third Embodiment

Next, an example in which the present invention is applied to manufacturing equipment of electroluminescence display device will be described.

Figure 18A:
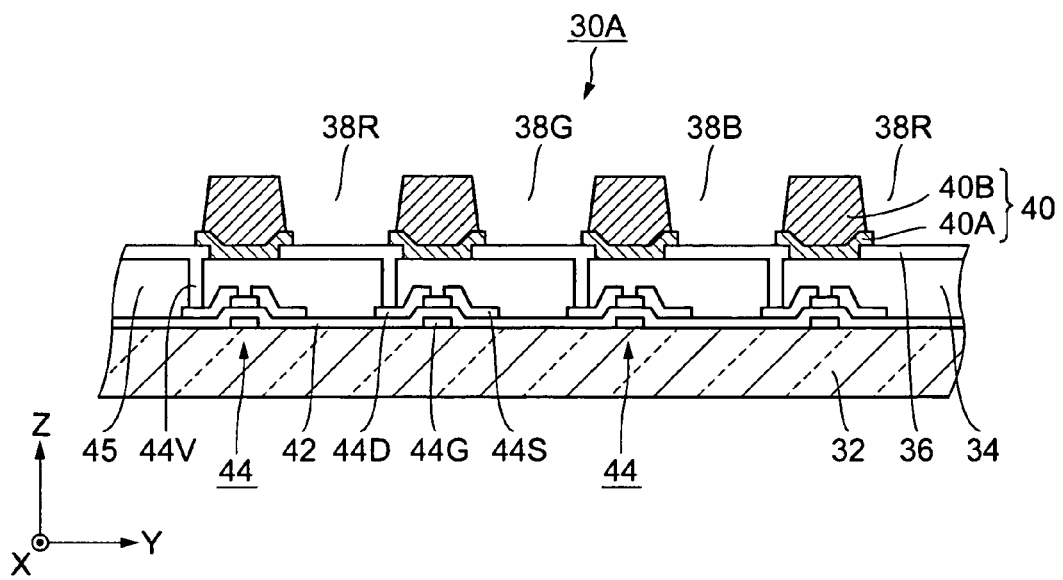
FIG. 18A is a schematic drawing illustrating a section of a base substrate of a third embodiment of the present invention.

A base substrate 30A shown in FIGS. 18A and 18B serves as an electroluminescence display device 30 by processing using manufacturing equipment 2 (FIG. 19) that will be described later. The base substrate 30A includes a plurality of parts to be ejected 38R, 38G, and 38 B that are arranged in a matrix.

Specifically, the base substrate 30A includes a supporting substrate 32, a circuit element layer 34 formed on the supporting substrate 32, a plurality of pixel electrodes 36 formed on the circuit element layer 34, and a bank 40 formed between the pixel electrodes 36. The supporting substrate is one that has transparency to visible light, for example, a glass substrate. Each pixel electrode 36 is one that has transparency to visible light, for example, indium tin oxide (ITO) electrode. Also, the plurality of pixel electrodes 36 is arranged on the circuit element layer 34 in a matrix form. Each pixel electrode 36 defines the pixel region. The bank 40 has a lattice-shaped. The bank 40 surrounds each pixel electrode 36. Also, the bank includes an inorganic bank 40A and an organic bank 40B positioned on the inorganic bank 40A.

The circuit element layer 34 includes: a plurality of scanning electrodes that extend in a predetermined direction on the supporting substrate 32; an insulation film 42 that is formed so as to cover the plurality of scanning electrodes; a plurality of signal lines that are located on the insulation film 42 and extended in the direction orthogonal to the direction in which the plurality of scanning electrodes are extended; a plurality of switching elements 44, each of the plurality of switching elements 44 located in the vicinity of the intersection of the scanning electrode and the signal line; and an interlayer insulation film 45, such like polyimide etc., that is formed so as to cover the plurality of switching elements 44. A gate electrode 44G and a source electrode 44S of each switching element 44 are electrically connected to respective scanning electrodes and respective signal electrodes. The plurality of pixel electrodes 36 are located on the interlayer insulation film 45. In the interlayer insulation film 45, a through hole 44V is provided at the part corresponds to a drain electrode 44D of each switching element 44. The switching element 44 and the pixel electrode 36 corresponding to the switching element 44 are electrically connected with the through hole 44V. Each switching element 44 is located at the position that corresponds to the bank 40. That is, according to the view from the direction perpendicular to FIG. 13B, each switching element 44 is located so as to be covered with the bank 40.

Each concave part defined by the pixel electrode 36 and the bank 40 (a part of the pixel region) of the base substrate 30A corresponds to parts to be ejected 38R, 38G, and 38B. The part to be ejected 38R is the region in which a luminous layer 211FR that emits light in a red wavelength range is formed. The part to be ejected 38G is the region in which a luminous layer 211FG that emits light in a green wavelength range is formed. The part to be ejected 38B is the region in which a luminous layer 211FB that emits light in a blue wavelength range is formed.

Figure 18B:
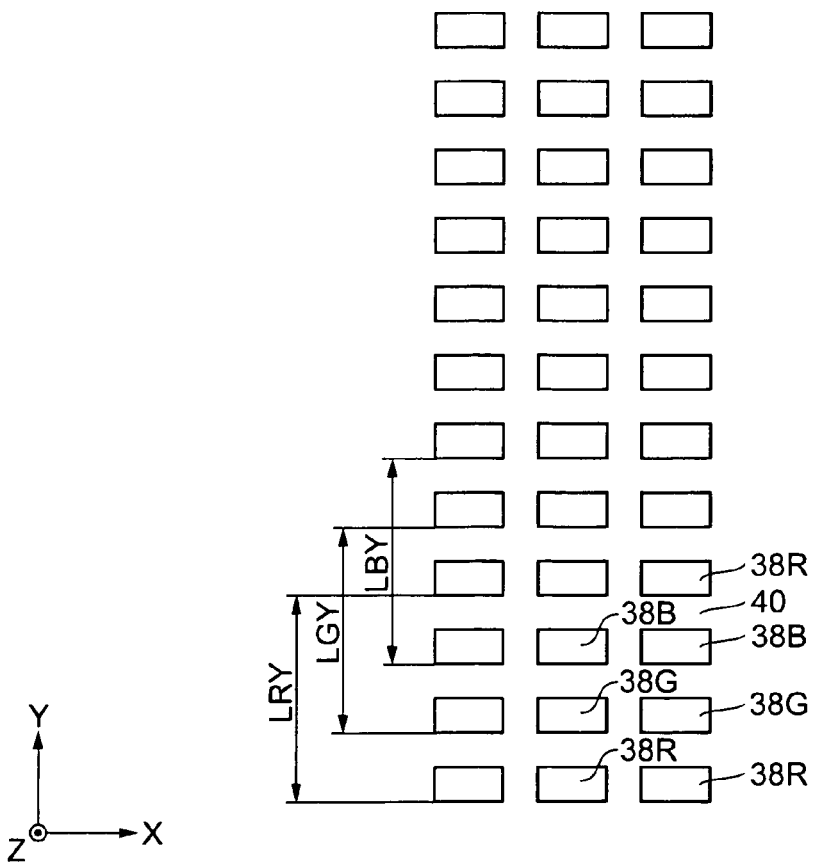
FIG. 18B is a schematic drawing illustrating an upper face of the base substrate of the third embodiment.

The base substrate 30A shown in FIG. 18B is located on a virtual plane parallel to both the X-axis direction and the Y-axis direction. The rows and the columns of the matrix that is formed of the plurality of the parts to be ejected 38R, 38G and 38B are parallel to the X-axis direction and the Y-axis direction respectively. In the base substrate 30A, the parts to be ejected 38R, 38G and 38B are periodically arranged in the Y-axis direction in this order. In contrast, the parts to be ejected 38R align in the X-axis direction at a predetermined fixed interval, the parts to be ejected 38G align in the X-axis direction at a predetermined fixed interval. Likewise, the parts to be ejected 38B align in the X-axis direction at a predetermined fixed interval. Here, the X-axis direction and the Y-axis direction are orthogonal to each other.

An interval LRY between two parts to be ejected 38R along the Y-axis direction, namely a pitch is approximately 560 μm. The interval LRY is the same as an interval LGY between two parts to be ejected 38G along the Y-axis direction and an interval LBY between two parts to be ejected 38B along the Y-axis direction. The planar image of part to be ejected 38R is a rectangular defined by a long edge and a short edge. Specifically, the length of the part to be ejected 38R in the Y-axis direction is approximately 100 μm and that in the X-direction is approximately 300 μm. The parts to be ejected 38G and 38B are the same shape and size of the part to be ejected 38R. The above-mentioned size of the parts to be ejected and the above-mentioned intervals between the parts to be ejected correspond to the size of pixels and the interval between pixels corresponding to the same color in a high-vision television of approximately 40 inches.

Figure 19:
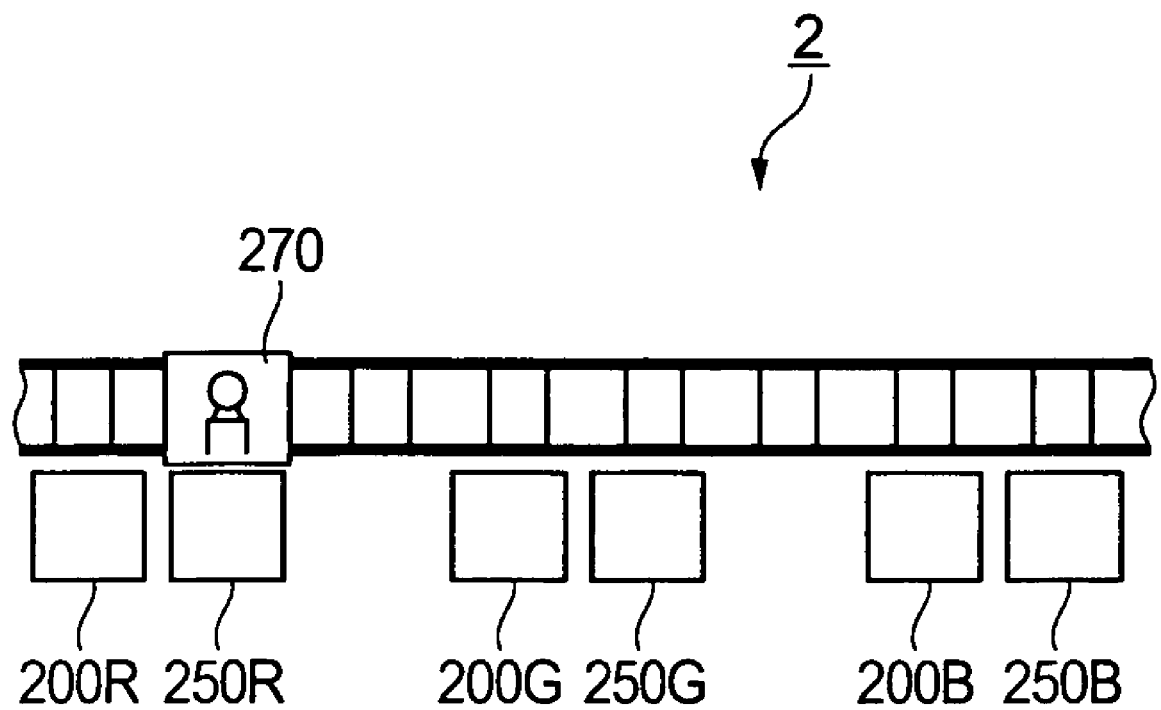
FIG. 19 is a schematic drawing illustrating manufacturing equipment of an electroluminescence display device of the third embodiment.

Manufacturing equipment 2 shown in FIG. 19 is equipment to eject a correspondent luminous material to each of parts to be ejected 38R, 38G and 38B of the base substrate 30A in FIG. 18. The manufacturing equipment 2 includes an ejection device 200R that applies a luminous material 211R to all of the parts to be ejected 38R, a drying device 250R that dries the luminous material 211R on the parts to be ejected 38R, an ejection device 200G that applies a luminous material 211G to all of the parts to be ejected 38G, a drying device 250G that dries the luminous material 211G on the parts to be ejected 38G, an ejection device 200B that applies a luminous material 211B to all of the parts to be ejected 38B, and a drying device 250B that dries the luminous material 211B on the parts to be ejected 38B. Further, the manufacturing equipment 2 includes a transfer device 270 that carries the base substrate 30A to the ejection device 200R, the drying device 250R, the ejection device 200G, the drying device 250G, the ejection device 200B, and the drying device 250B, in this order. The transfer device 270 is equipped with a fork unit, a driver to move the fork unit up and down, and a self-traveling unit.

Figure 20:
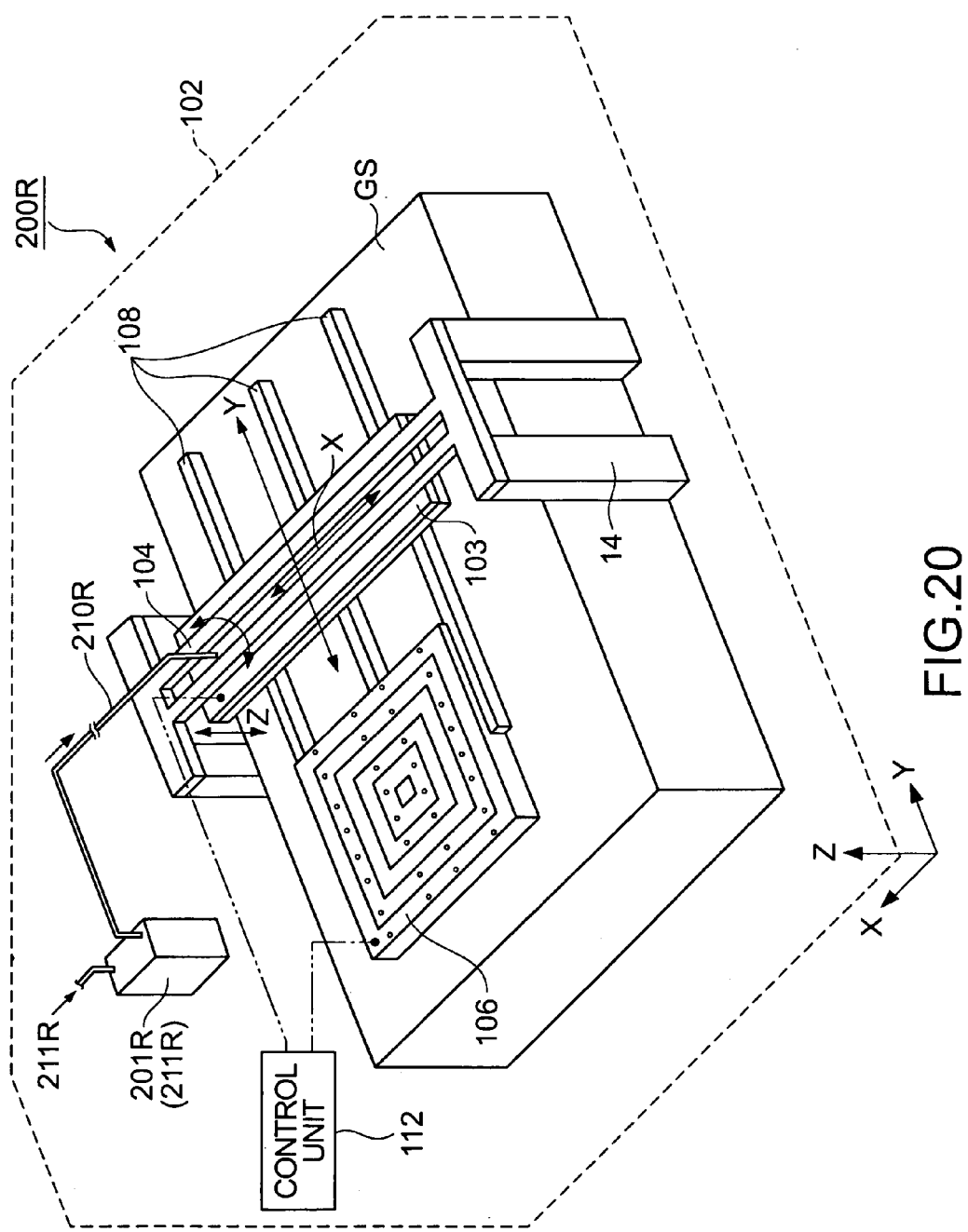
FIG. 20 is a schematic drawing illustrating an ejection device of the third embodiment.

The ejection device 200R shown in FIG. 20 includes a tank 201R where the liquid luminous material 211R is stored and the ejecting and scanning part 102 into which the luminous material 211R is provided from the tank 201R through a tube 210R. Since the construction of the ejecting and scanning part 102 is the same as that of the ejecting and scanning part 102 (FIG. 1) in the first embodiment, overlapping explanation will be omitted with the same reference numerals given to the same construction elements as those in the first embodiment. Also, both of the construction of the ejection device 200G and the construction of the ejection device 200B are essentially the same as that of the ejection device 200R. However, the construction of the ejection device 200G differs from that of the ejection device 200R in that it has. a tank and a tube for the luminous material 211G instead of the tank 201R and the tube 210R. Likewise, the construction of the ejection device 200B differs from that of the ejection device 200R in that it has a tank and a tube for the luminous material 211B instead of the tank 201R and the tube 210R. Each of liquid luminous materials 111R, 111G, and 111B of the embodiment is an example of "a liquid material" of the present invention.

A method of manufacturing the electroluminescence device 30 using the manufacturing equipment 2 will be described. First, the base substrate 30A shown in FIG. 18 is manufactured using a known film forming technique and a known patterning technique.

Next, the base substrate 30A is given lyophilicity by oxygen plasma under the atmospheric pressure. By the treatment, the surface of the pixel electrode 36, the surface of the inorganic bank 40A, and the surface of the organic bank 40B in each concave part defined by the pixel electrode 36 and the bank 40 (a part of the pixel region) exhibit lyophilicity. Additionally, the base substrate 30A is subjected to a plasma treatment in which tetrafluoromethane is used as treatment gas. With the plasma treatment using tetrafluoromethane, the surface of the organic bank 40B in each concave part is fluorinated (lyophobicity is given). Thus, the surface of the organic bank 40B exhibits lyophobicity. With the plasma treatment using tetrafluoromethane, the surface of the pixel electrode 36 and the surface of the inorganic bank 40A both of which lyophilicity has been given to lose lyophilicity somewhat. However, these surfaces still maintain sufficient lyophilicity. In this way, by performing predetermined surface treatments to the surface of each concave part defined by the pixel electrode 36 and the bank 40, the surface of the concave part serves the parts to be ejected 38R, 38G, and 38B.

Depending on materials of the pixel electrode 36, the inorganic bank 40A, and the organic bank 40B, the surface that exhibits desired lyophilicity and lyophobicity can be obtained without the above-mentioned treatments. In such a case, the surface of the concave part defined by the pixel electrode 36 and the bank 40 serves the parts to be ejected 38R, 38G, and 38B without the above-mentioned treatments.

Here, hole transport layers 37R, 37G, and 37B may be respectively formed on each of the pixel electrodes 36 on which the surface treatment has been conducted. If the hole transport layers 37R, 37G, and 37B are located between the pixel electrodes 36 and the luminous layers 211RF, 211GF, and 211BF, which will be described later, luminous efficiency of the electroluminescence display device is increased. In the case where each hole transport layer is formed on each of the pixel electrodes 36, each concave defined by the hole transport layer and the bank 40 corresponds to each of the parts to be ejected 38R, 38G, and 38B.

The hole transport layers 37R, 37G, 37B can be formed by means of an inkjet method. In this case, the hole transport layers are formed by the following manner. A predetermined amount of liquid containing materials for forming the hole transport layers 37R, 37G, 37B is applied to each pixel region. Then, they are dried to form the hole transport layers.

Figure 21A:
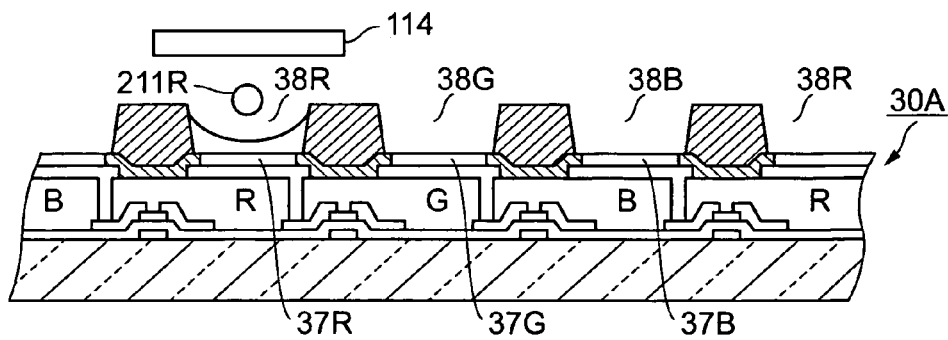
FIGS. 21A-21D are diagrams explaining a method of manufacturing an electroluminescence display device of the third embodiment.

The base substrate 30A on which the parts to be ejected 38R, 38G and 38B are formed is carried by the transfer device 270 to the stage 106 of the ejection device 200R. Then, as shown in FIG. 21A, the ejection device 200R ejects the luminous material 211R from the head 114 corresponding to ejectedata so as to form the layer of the luminous material 211R on all of the parts to be ejected 38R. More specifically, the ejection device 200R applies the luminous material 211R to each part to be ejected 38R by performing the application processes in the first embodiment.

After the layer of the luminous material 211R is formed on all of the parts to be ejected 38R of the base substrate 30A, the transfer device 270 puts the base substrate 30A in the drying device 250R. Then, a luminous layer 211FR is obtained on the parts to be ejected 38R by completely drying the luminous material 211R on the parts to be ejected 38R.

Figure 21B:
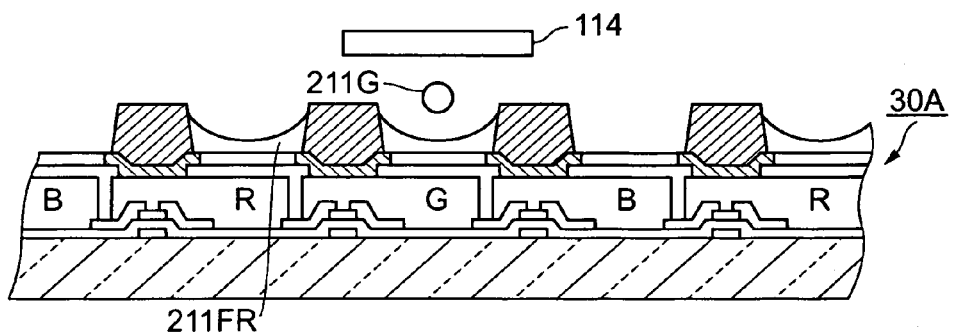

Next, the transfer device 270 puts the base substrate 30A on the stage 106 of the ejection device 200G. Then, as shown in FIG. 21B, the ejection device 200G ejects the luminous material 211G from the head 114 in accordance with ejectedata that corresponds to the part to be ejected 38G so as to form the layer of the luminous material 211G on all of the parts to be ejected 38G. More specifically, the ejection device 200G applies the luminous material 211G to each part to be ejected 38G by performing the application processes in the first embodiment.

After the layer of the luminous material 211G is formed on all of the parts to be ejected 38G of the base substrate 30A, the transfer device 270 puts the base substrate 30A in the drying device 250G. Then, a luminous layer 211FG is obtained on the parts to be ejected 38G by completely drying the luminous material 211G on the parts to be ejected 38G.

Figure 21C:
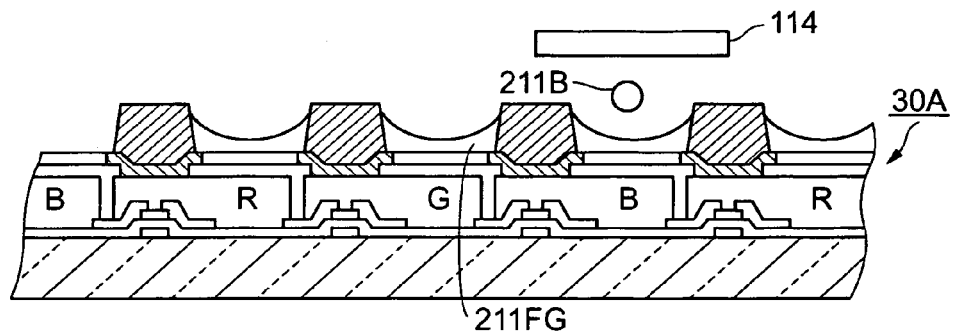

Next, the transfer device 270 puts the base substrate 30A on the stage 106 of the ejection device 200B. Then, as shown in FIG. 21C, the ejection device 200B ejects the luminous material 211B from the head 114 in accordance with ejectedata that corresponds to the part to be ejected 38B so as to form the layer of the luminous material 211B on all of the parts to be ejected 38B. More specifically, the ejection device 200B applies the luminous material 211B to each part to be ejected 38B by performing the application processes in the first embodiment.

After the layer of the luminous material 211B is formed on all of the parts to be ejected 38B of the base substrate 30A, the transfer device 270 puts the base substrate 30A in the drying device 250B. Then, a luminous layer 211FB is obtained on the parts to be ejected 38B by completely drying the luminous material 211B on the parts to be ejected 38B.

Figure 21D:
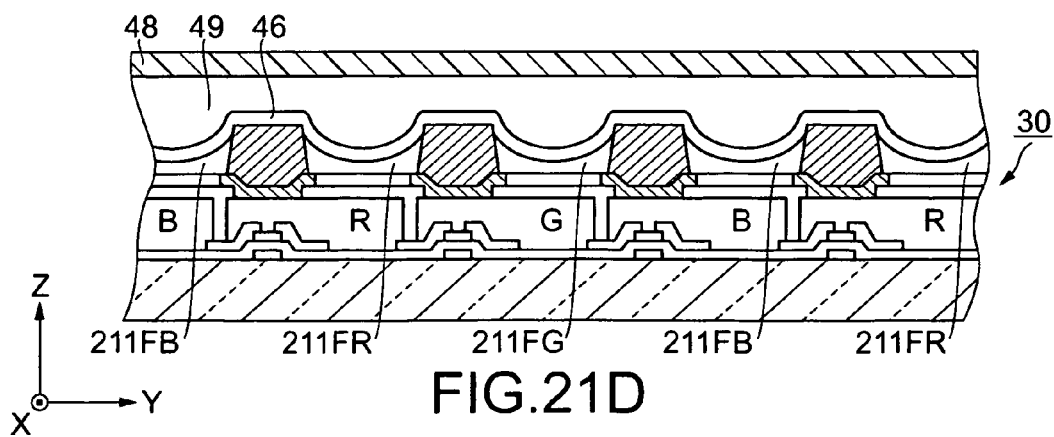

Next, as shown in FIG. 21D, a counter electrode 46 is formed so as to cover the luminous layers 211FR, 211FG, and 211FB. The counter electrode 46 functions as a cathode.

Then, the electroluminescence display device 30 shown in FIG. 21D is obtained by bonding a sealing substrate 48 and the base substrate 30A at a mutual circumference part with an adhesive. Inert gas 49 is enclosed in the sealing substrate 48 and the base substrate 30A.

In the electroluminescence display device 30, light emitted from the luminous layers 211FR, 211FG, and 211FB is emitted through the pixel electrode 36, the circuit element layer 34, and the supporting substrate 32. Thus, the electroluminescence display device in which light is emitted though the circuit element layer 34 is called a bottom emission type display device.

Fourth Embodiment

An example in which the present invention is applied to manufacturing equipment of a back substrate of a plasma display device will be described.

Figure 22A:
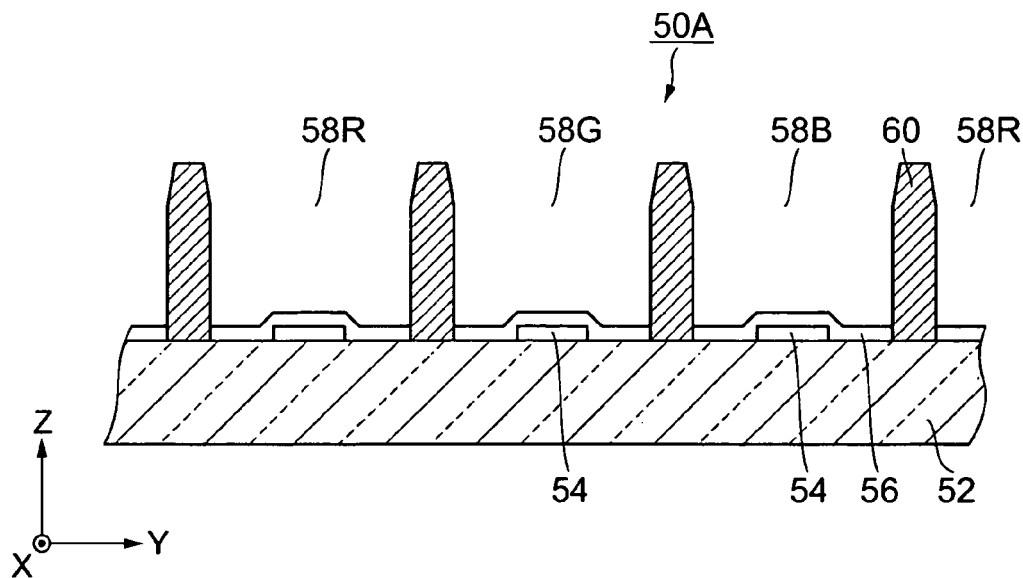
FIG. 22A is a schematic drawing illustrating a section of a base substrate of a fourth embodiment of the present invention.

A base substrate 50A shown in FIGS. 22A and 22B serves as a back substrate 50B of an electroluminescence display device by processing using manufacturing equipment 3 (FIG. 23) that will be described later. The base substrate 50A includes a plurality of parts to be ejected 58R, 58G, and 58B that are arranged in a matrix.

Specifically, the base substrate 50A includes a supporting substrate 52, a plurality of address electrodes 54 formed as a stripe like on the supporting substrate 52, a dielectric glass layer 56, and partition 60 that form a lattice-shaped and define the plurality of pixel regions. The plurality of pixel regions is arranged in a matrix from. Each of columns of the matrix formed by the plurality of pixel regions corresponds to each of the plurality of address electrodes 54. The base substrate 50A is formed by a known screen printing technique.

Each concave part defined by the dielectric glass layer 56 and the partition 60 in each of the pixel regions of the base substrate 50A, corresponds to parts to be ejected 58R, 58G, and 58B. The part to be ejected 58R is the region in which a fluorescence layer 311FR that emits light in a red wavelength range is formed. The part to be ejected 58G is the region in which a fluorescence layer 311FG that emits light in a green wavelength range is formed. The part to be ejected 58B is the region in which a fluorescence layer 311FB that emits light in a blue wavelength range is formed.

Figure 22B:
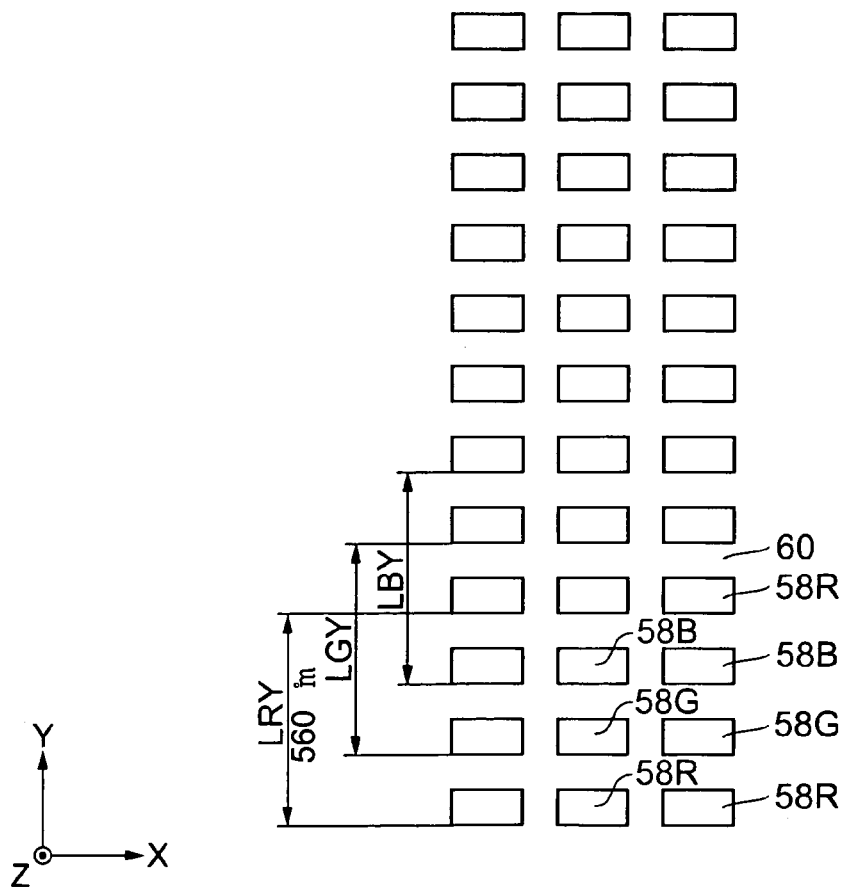
FIG. 22B is a schematic drawing illustrating an upper face of the base substrate of the fourth embodiment.

The base substrate 50A shown in FIG. 22B is located on a virtual plane parallel to both the X-axis direction and the Y-axis direction. The rows and the columns of the matrix that is formed of the plurality of the parts to be ejected 58R, 58G and 58B are parallel to the X-axis direction and the Y-axis direction respectively. In the base substrate 50A, the parts to be ejected 58R, 58G and 58B are periodically arranged in the Y-axis direction in this order. In contrast, the parts to be ejected 58R align in the X-axis direction at a predetermined fixed interval, the parts to be ejected 58G align in the X-axis direction at a predetermined fixed interval. Likewise, the parts to be ejected 58B align in the X-axis direction at a predetermined fixed interval. Here, the X-axis direction and the Y-axis direction are orthogonal to each other.

An interval LRY between two parts to be ejected 58R along the Y-axis direction, namely a pitch is approximately 560 μm. The interval LRY is the same as an interval LGY between two parts to be ejected 58G along the Y-axis direction and an interval LBY between two parts to be ejected 58B along the Y-axis direction. The planar image of part to be ejected 58R is a rectangular defined by a long edge and a short edge. Specifically, the length of the part to be ejected 58R in the Y-axis direction is approximately 100 μm and that in the X-direction is approximately 300 μm. The parts to be ejected 58G and 58B are the same shape and size of the part to be ejected 58R. The above-mentioned size of the parts to be ejected and the above-mentioned intervals between the parts to be ejected correspond to the size of pixels and the interval between pixels corresponding to the same color in a high-vision television of approximately 40 inches.

Figure 23:
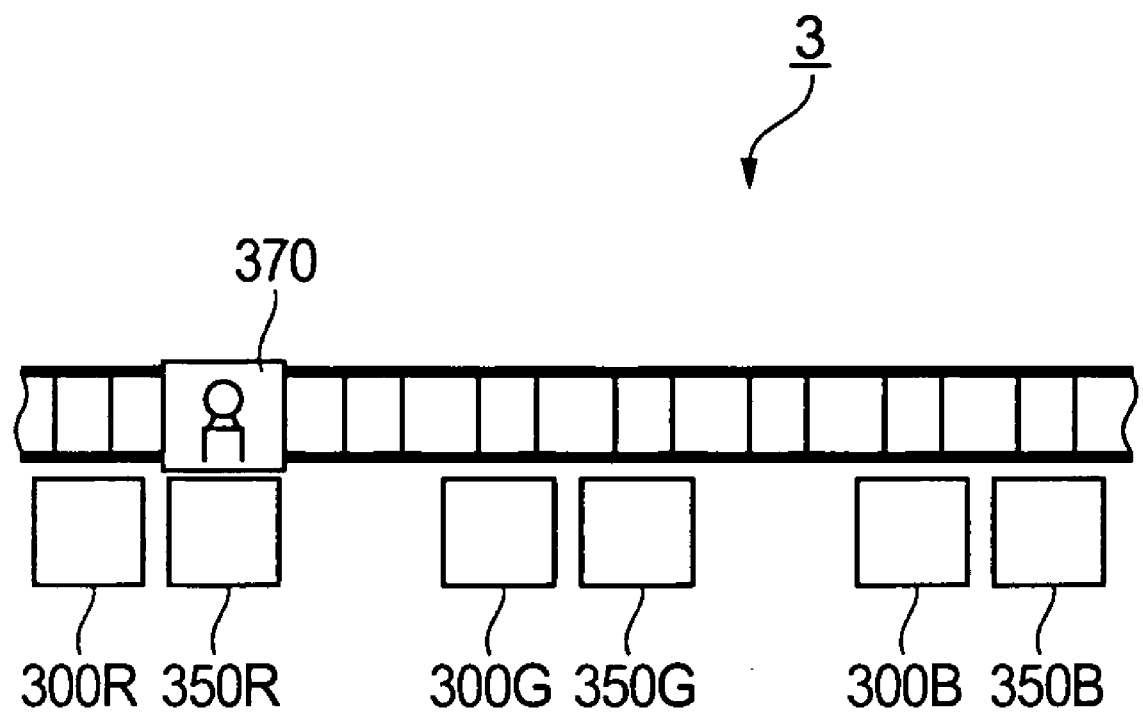
FIG. 23 is a schematic drawing illustrating manufacturing equipment of a plasma display device of the fourth embodiment.

Manufacturing equipment 3 shown in FIG. 23 is equipment to eject a correspondent fluorescence material to each of parts to be ejected 58R, 58G and 58B of the base substrate 50A in FIG. 22. The manufacturing equipment 3 includes an ejection device 300R that applies a fluorescence material 311R to all of the parts to be ejected 58R, a drying device 350R that dries the fluorescence material 311R on the parts to be ejected 58R, an ejection device 300G that applies a fluorescence material 311G to all of the parts to be ejected 58G, a drying device 350G that dries the fluorescence material 311G on the parts to be ejected 38G, an ejection device 300B that applies a luminous material 311B to all of the parts to be ejected 58B, and a drying device 350B that dries the fluorescence material 311B on the parts to be ejected 58B. Further, the manufacturing equipment 3 includes a transfer device 370 that carries the base substrate 50A to the ejection device 300R, the drying device 350R, the ejection device 300G, the drying device 350G, the ejection device 300B, and the drying device 350B, in this order. The transfer device 370 is equipped with a fork unit, a driver to move the fork unit up and down, and a self-traveling unit.

Figure 24:
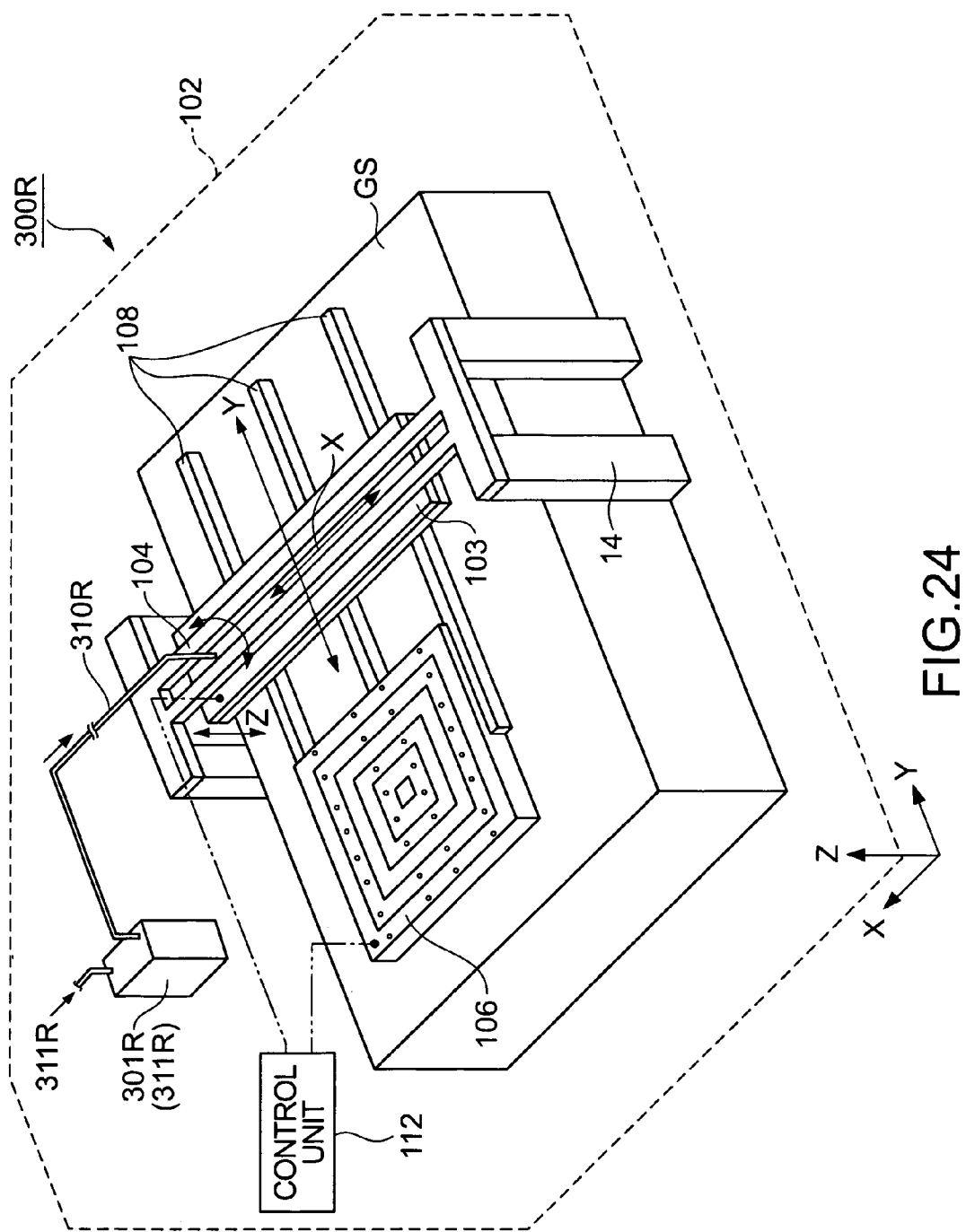
FIG. 24 is a schematic drawing illustrating an ejection device of the fourth embodiment.

The ejection device 300R shown in FIG. 24 includes a tank 301R where the liquid fluorescence material 311R is stored and the ejecting and scanning part 102 into which the fluorescence material 311R is provided from the tank 301R through a tube 310R. The construction of ejecting and scanning part 102 has been described in the first embodiment. Thus, overlapping explanations will be omitted.

Both of the construction of the ejection device 300G and the construction of the ejection device 300B are essentially the same as that of the ejection device 300R. However, the construction of the ejection device 300G differs from that of the ejection device 300R in that it has a tank and a tube for the fluorescence material 311G instead of the tank 301R and the tube 310R. Likewise, the construction of the ejection device 300B differs from that of the ejection device 300R in that it has a tank and a tube for the fluorescence material 311B instead of the tank 301R and the tube 310R. Each of liquid fluorescence materials 311R, 311G, and 311B of the embodiment is an example of "a liquid material" of the present invention.

A method of manufacturing a plasma display device using the manufacturing equipment 3 will be described. First, the plurality of address electrodes 54, the dielectric glass layer 56 and the partition 60 are formed on the supporting substrate 52 by a known screen printing technique to obtain the base substrate 50A shown in FIG. 22.

Next, the base substrate 50A is given lyophilicity by oxygen plasma under the atmospheric pressure. By the treatment, the surface of the partition 60 and the surface of the dielectric glass layer 56 in each concave part defined by the partition 60 and the dielectric glass layer 56 (a part of the pixel region) exhibits lyophilicity. These surfaces serve the parts to be ejected 58R, 58G, and 58B. Depending on materials, the surface that exhibits desired lyophilicity can be obtained without the above-mentioned treatments. In such a case, the surface of each concave part defined by the partition 60 and the dielectric glass layer 56 serve the parts to be ejected 58R, 58G, and 58B without the above-mentioned treatments.

Figure 25A:
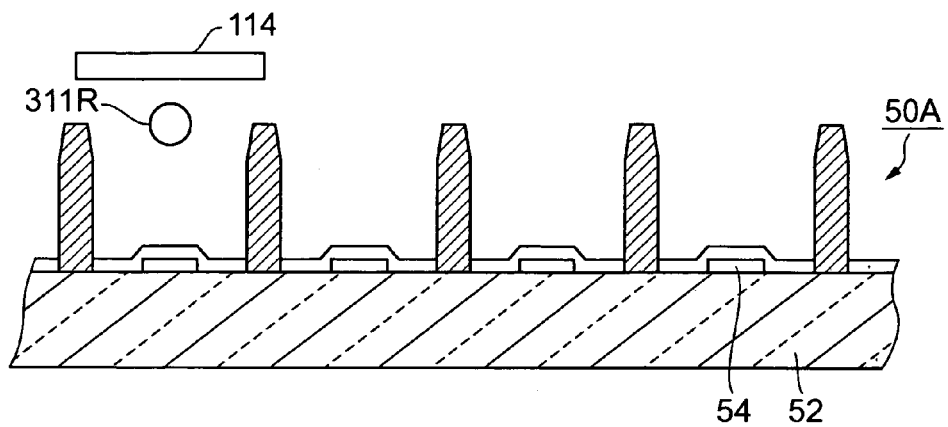
FIGS. 25A-25C are diagrams explaining a method of manufacturing a plasma display device of the fourth embodiment.

The base substrate 50A on which the parts to be ejected 58R, 58G and 58B are formed is carried by the transfer device 370 to the stage 106 of the ejection device 300R. Then, as shown in FIG. 25A, the ejection device 300R ejects the fluorescence material 311R from the head 114 corresponding to ejection data so as to form the layer of the fluorescence material 311R on all of the parts to be ejected 58R. More specifically, the ejection device 300R applies the fluorescence material 311R to each part to be ejected 58R by performing the application processes in the first embodiment.

After the layer of the fluorescence material 311R is formed on all of the parts to be ejected 58R of the base substrate 50A, the transfer device 370 puts the base substrate 50A in the drying device 350R. Then, a fluorescence layer 311FR is obtained on the parts to be ejected 58R by completely drying the fluorescence material 311R on the parts to be ejected 58R.

Figure 25B:
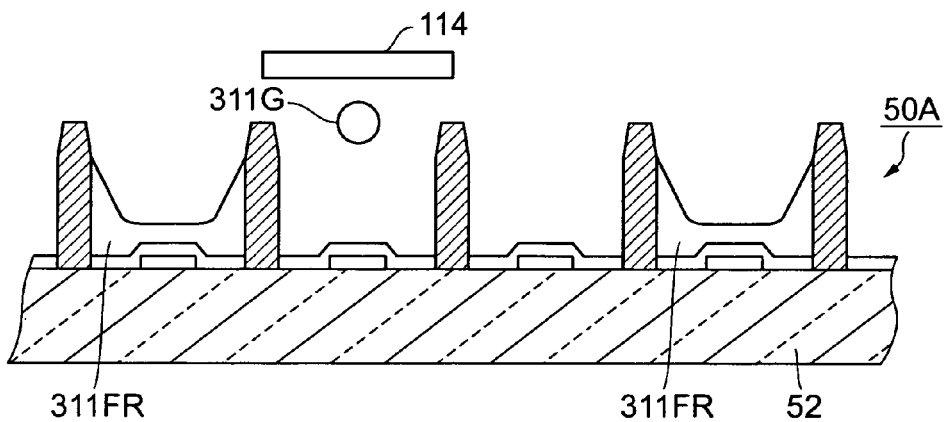

Next, the transfer device 370 puts the base substrate 50A on the stage 106 of the ejection device 300G. Then, as shown in FIG. 25B, the ejection device 300G ejects the fluorescence material 311G from the head 114 in accordance with ejectedata that corresponds to the part to be ejected 58G so as to form the layer of the fluorescence material 311G on all of the parts to be ejected 58G. More specifically, the ejection device 300G applies the fluorescence material 311G to each part to be ejected 58G by performing the application processes in the first embodiment.

After the layer of the fluorescence material 311G is formed on all of the parts to be ejected 58G of the base substrate 50A, the transfer device 370 puts the base substrate 50A in the drying device 350G. Then, a fluorescence layer 311FG is obtained on the parts to be ejected 58G by completely drying the fluorescence material 311G on the parts to be ejected 58G.

Figure 25C:
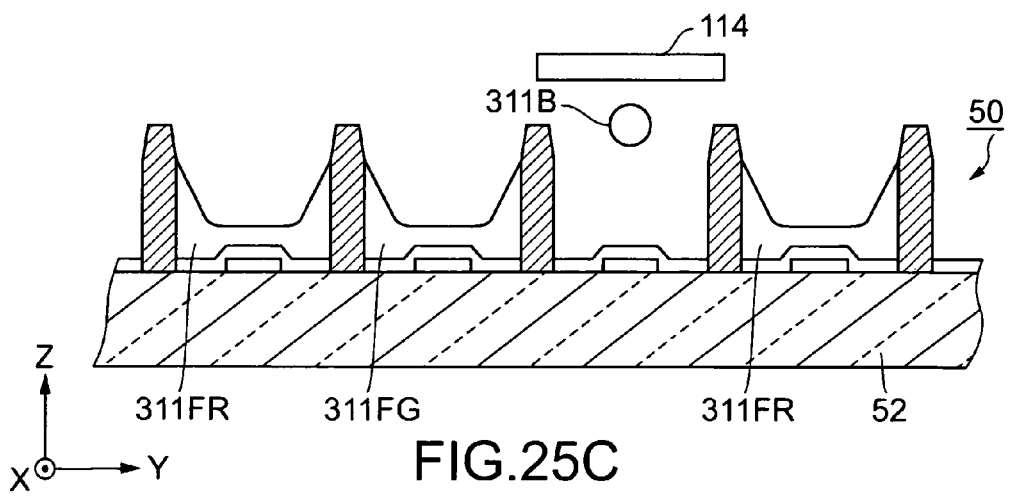

Next, the transfer device 370 puts the base substrate 50A on the stage 106 of the ejection device 300B. Then, as shown in FIG. 25C, the ejection device 300B ejects the fluorescence material 311B from the head 114 in accordance with ejection data that corresponds to the part to be ejected 58B so as to form the layer of the fluorescence material 311B on all of the parts to be ejected 58B. More specifically, the ejection device 300B applies the fluorescence material 311B to each part to be ejected 58B by performing the application processes in the first embodiment.

After the layer of the fluorescence material 311B is formed on all of the parts to be ejected 58B of the base substrate 50A, the transfer device 370 puts the base substrate 50A in the drying device 350B. Then, a luminous layer 311FB is obtained on the parts to be ejected 58B by completely drying the luminous material 311B on the parts to be ejected 58B.

The base substrate 50A serves as the back substrate 50B of the plasma display device by the above-mentioned processes.

Figure 26:
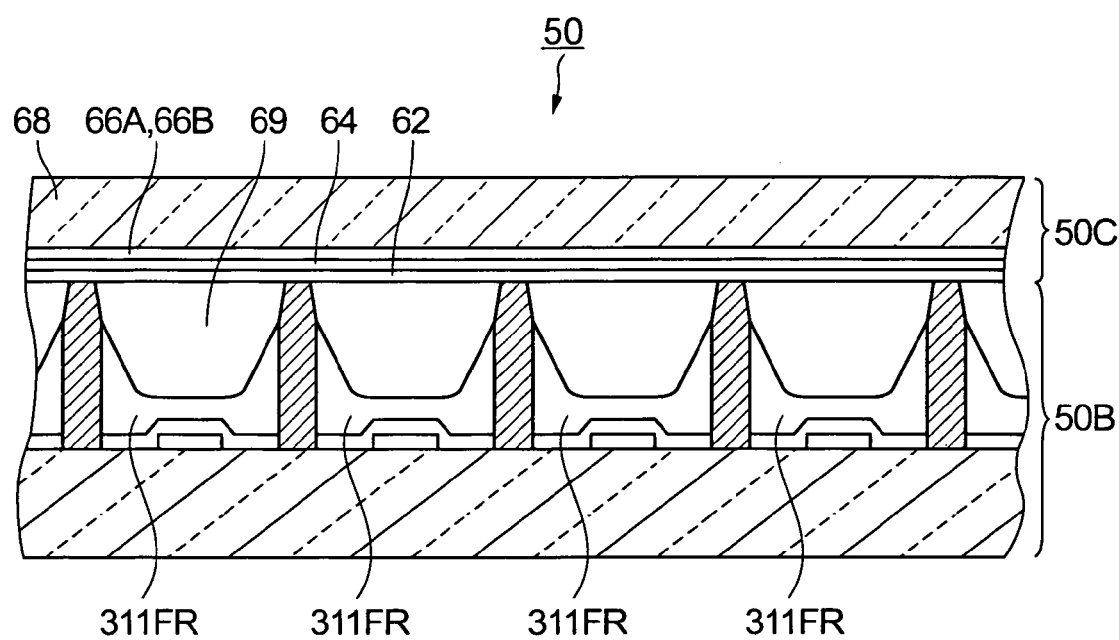
FIG. 26 is a schematic drawing illustrating a section of a plasma display device manufactured by the method of the fourth embodiment.

Then, as shown in FIG. 26, the back substrate 50B and a front substrate 50C are bonded by a known method to obtain a plasma display device 50. The front substrate 50C includes: a glass substrate 68; a display electrode 66A and a display scanning electrode 66B both of which are patterned on the glass substrate 68 in parallel each other; a dielectric glass layer 64 that is formed so as to cover the display electrode 66A and the display scanning electrode 66B; and a magnesium oxide (MgO) protection layer 62 that is formed on the dielectric glass layer 64. The back substrate 50B and the front substrate 50C are aligned such that the address electrode 54 of the back substrate 50B and the display electrode 66A and the display scanning electrode 66B of the front substrate 50C are orthogonal to each other. Ejecting gas 69 is enclosed in the cell surrounded by the partition 60 (pixel region) with a predetermined pressure.

Fifth Embodiment

Next, an example in which the present invention is applied to manufacturing equipment of an image display device with electron emission elements will be described.

Figure 27A:
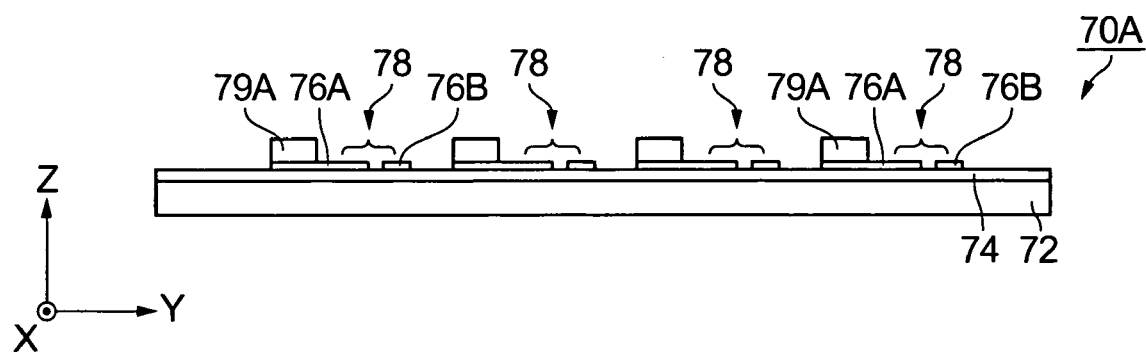
FIG. 27A is a schematic drawing illustrating a section of a base substrate of a fifth embodiment of the present invention.

A base substrate 70A shown in FIGS. 27A and 27B serve as an electron source substrate 70B of an image display device by processing using manufacturing equipment 3 (FIG. 28) that will be described later. The base substrate 70A includes a plurality of parts to be ejected 78 arranged in a matrix.

Specifically, the base substrate 70A includes a base substrate 72, a sodium diffusion preventing layer 74 formed on the base substrate 72, a plurality of element electrodes 76A and 76B formed on the sodium diffusion preventing layer 74, a plurality of metal wirings 79A formed on the plurality of element electrodes 76A, and a plurality of metal wirings 79B formed on the plurality of element electrodes 76B. Each of the plurality of metal wirings 79A has a shape that extends in the Y-axis direction. In contrast, each of the plurality of metal wirings 79B has a shape that extends in the X-axis direction. An insulation film 75 is formed between the metal wirings 79A and 79B. Thus, the metal wirings 79A and 79B are electrically insulated.

A part that includes a pair of the element electrode 76A and the element electrode 76B corresponds to one pixel region. The pair of the element electrodes 76A and 76B are faced each other on the sodium diffusion preventing layer 74 with a predetermined distance. The element electrode 76A that corresponds to a pixel region is electrically connected to respective metal wiring 79A. Also, the element electrode 76B that corresponds to the pixel region is electrically connected to respective, metal wiring 79B. In the specification, the part combining the base substrate 72 and the sodium diffusion preventing layer 74 may be described as a supporting substrate.

In each pixel region of the base substrate 70A, a part of the element electrode 76A, a part of the element electrode 76B, and the sodium diffusion preventing layer 74 that is exposed between the element electrode 76A and the element electrode 76B correspond to the part to be ejected 78. More specifically, the part to be ejected 78 is the region on which a conductive thin film 411F (FIG. 31) is formed. The conductive thin film 411F is formed so as to cover the part of the element electrode 76A, the part of the element electrode 76B and a gap between the element electrode 76A and the element electrode 76B. The planar shape of the part to be ejected 78 in the embodiment is a circular form as shown in FIG. 27B by dotted line. In this way, the circular form defined by the x-coordinate range and the y-coordinate range is acceptable as the planar shape of the part to be ejected in the present invention.

Figure 27B:
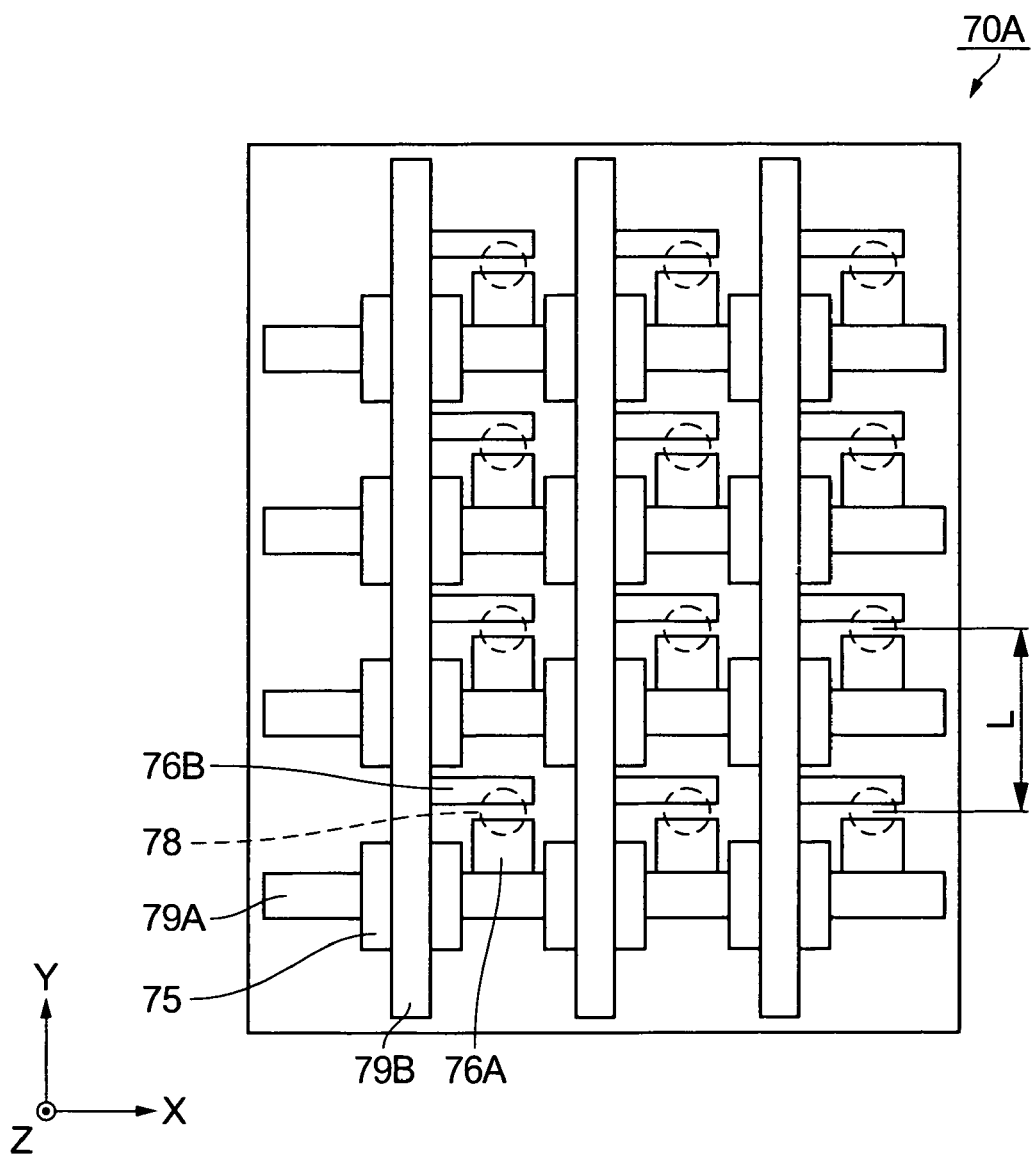
FIG. 27B is a schematic drawing illustrating an upper face of the base substrate of the fifth embodiment.

The base substrate 70A shown in FIG. 27B is located on a virtual plane parallel to both the X-axis direction and the Y-axis direction. The rows and the columns of the matrix that is formed of the plurality of the parts to be ejected 78 are parallel to the X-axis direction and the Y-axis direction respectively. That is, in the base substrate 70A, the plurality of parts to be ejected 78 is arranged in the X-axis direction and the Y-axis direction. Here, the X-axis direction and the Y-axis direction are orthogonal to each other.

An interval LRY between two parts to be ejected 78 along the Y-axis direction, namely a pitch is approximately 190 μm. The length of the part to be ejected 78 in the X-axis direction (the length of x-coordinate range) is approximately 100 μm and the length in the Y-axis direction (the length of y-coordinate) is also approximately 100 μm. The above-mentioned size of the parts to be ejected 78 and the above-mentioned intervals between the parts to be ejected 78 correspond to the size of pixel region and the interval between pixel regions in a high-vision television of approximately 40 inches.

Figure 28:
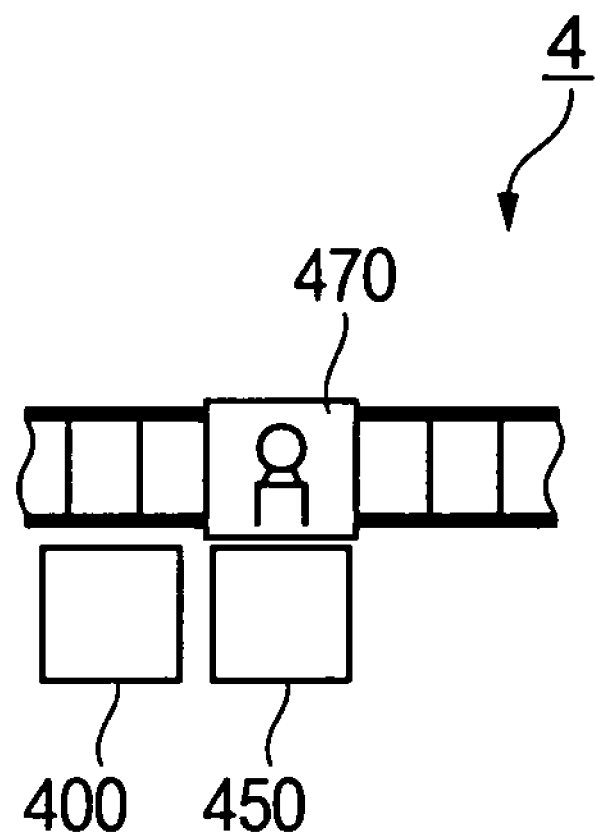
FIG. 28 is a schematic drawing illustrating manufacturing equipment of a display device of the fifth embodiment.

Manufacturing equipment 4 shown in FIG. 28 is equipment to eject a conductive thin film material 411 to each part to be ejected 78 of the base substrate 70A in FIG. 27. Specifically, the manufacturing equipment 4 includes an ejection device 400 that applies the conductive thin film material 411 to all of the parts to be ejected 78 and a drying device 450 that dries the conductive thin film material 411 on the parts to be ejected 78. Further, the manufacturing equipment 4 includes a transfer device 470 that carries the base substrate 70A to the ejection device 400 and the drying device 450 in this order. The transfer device 470 is equipped with a fork unit, a driver to move the fork unit up and down, and a self-traveling unit.

Figure 29:
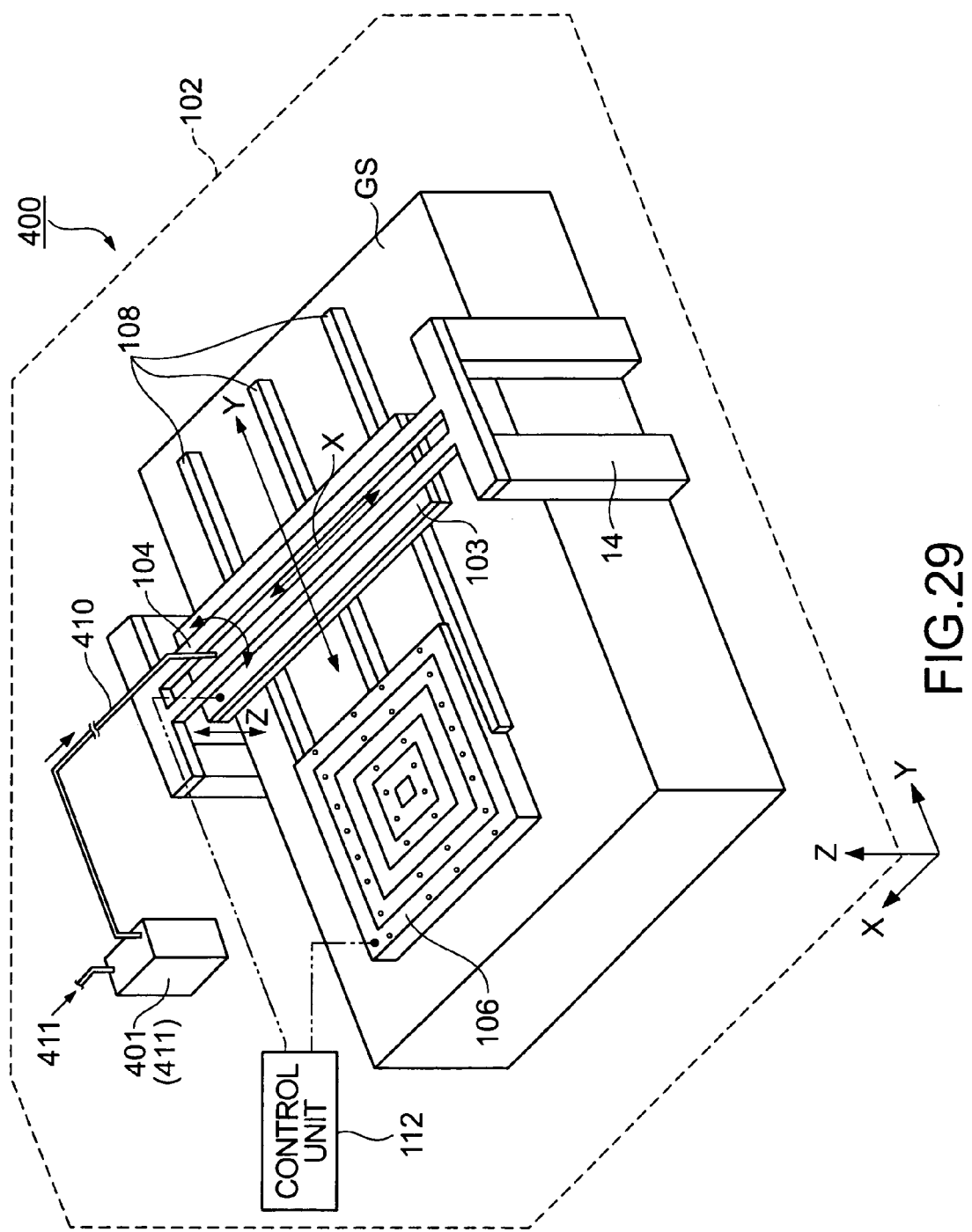
FIG. 29 is a schematic drawing illustrating an ejection device of the fifth embodiment.

The ejection device 400 shown in FIG. 29 includes a tank 401 where the liquid conductive thin film material 411 is stored and the ejecting and scanning part 102 into which the conductive thin film material 411 is provided from the tank 401 through a tube 410. The ejecting and scanning part 102 has been described in the first embodiment. Thus, the explanation will be omitted. In the embodiment, the liquid conductive thin film material 411 is an organic palladium solution. The liquid conductive thin film material 411 of the embodiment is an example of "a liquid material" of the present invention.

A method of manufacturing an image display device using the manufacturing equipment 4 will be described. First, the. sodium diffusion preventing layer 74 that consists primarily of silicon dioxides ($SiO_2$) is formed on the base substrate 72 made of a soda glass etc. Specifically, the sodium diffusion preventing layer 74 is obtained by forming the $SiO_2$ film with thickness of 1 μm on the base substrate 72 using sputtering. Then, a titanium layer with thickness of 5 nm is formed on the sodium diffusion preventing layer 74 by sputtering or a vapor deposition method. Subsequently, a pair of element electrodes 76A and 76B that are arranged apart from each other with a predetermined distance is formed from the titanium layer in multiple numbers using a photolithography and an etching technique.

Then, a silver (Ag) paste is applied to the sodium diffusion preventing layer 74 and the plurality of element electrodes 76A using a screen printing technique and is cured, whereby the plurality of metal wirings 79A that extend in the Y-axis direction are formed. Next, a glass paste is applied to a part of each metal wiring 79A using a screen printing technique and is cured, whereby the insulation film 75 is formed. Then, an Ag paste is applied to the sodium diffusion preventing layer 74 and the plurality of element electrodes 76B using a screen printing technique and is cured, whereby the plurality of metal wirings 79B that extend in the X-axis direction are formed. In the forming of metal wirings 79B, the Ag paste is applied such that the metal wiring 79B intersects the metal wiring 79A with the insulating film 75. The base substrate 70A shown in FIG. 27 is obtained by the above-mentioned processes.

Next, the base substrate 70A is given lyophilicity by oxygen plasma under the atmospheric pressure. By the treatment, a part of the surface of the element electrode 76A, a part of the surface of the element electrode 76B, and the surface of the supporting substrate that is exposed between the element electrodes 76A and 76B are given lyophilicity. Then, these surfaces serve as the part to be ejected 78. Depending on materials, the surface that exhibits desired lyophilicity can be obtained without the above-mentioned treatments. In such the case, the part of the surface of the element electrode 76A, the part of the surface of the element electrode 76B, and the surface of the supporting substrate that is exposed between the element electrodes 76A and 76B serve as the part to be ejected 78 without the above-mentioned treatment.

Figure 30:
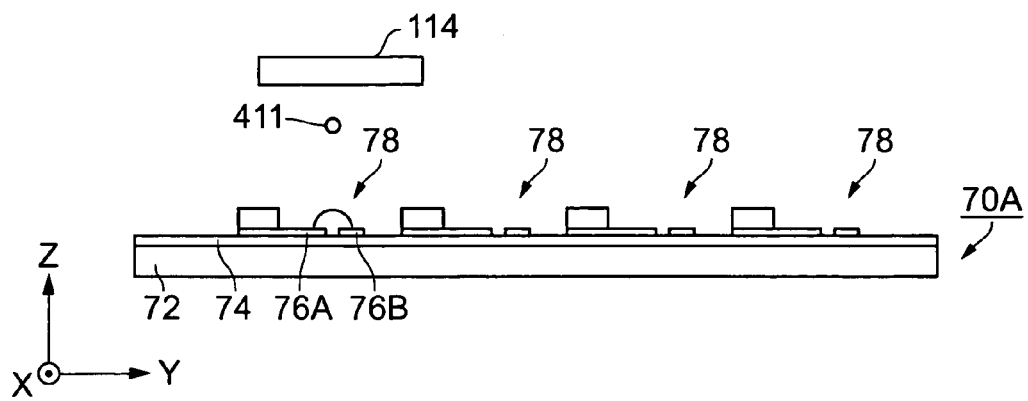
FIG. 30 is a diagram explaining a method of manufacturing a display device of the fifth embodiment.

The base substrate 70A on which the parts to be ejected 78 is formed is carried by the transfer device 470 to the stage 106 of the ejection device 400. Then, as shown in FIG. 30, the ejection device 400 ejects the conductive thin film material 411 from the head 114 in accordance with ejection data that has been described in the first embodiment so as to form the conductive thin film 411F on all of the parts to be ejected 78. More specifically, the ejection device 400 applies the conductive thin film material 411 to each part to be ejected 78 by performing the application processes in the first embodiment.

Also, in the embodiment, the control unit 112 applies a signal to the head 114 such that the diameter of the droplet of the conductive thin film material 411 landed on the part to be ejected 78 is within the range from 60 μm to 80 μm. After the layer of the conductive thin film material 411 is formed on all of the parts to be ejected 78 of the base substrate 70A, the transfer device 470 puts the base substrate 70A in the drying device 450. Then, the conductive thin film 411F that consists primarily of palladium oxide is obtained on the part to be ejected 78 by completely drying the conductive thin film material 411 on the part to be ejected 78. In this way, in each pixel region, the conductive thin film 411F is formed that covers a part of the element electrode 76A, a part of the element electrode 76B, and the sodium diffusion preventing layer 74 that is exposed between the element electrode 76A and the element electrode 76B.

Next, an electron emission part 411D is formed at a part of the conductive thin film 411F by applying a predetermined pulse-like voltage between the element electrodes 76A and 76B. It is preferable that the voltage is applied between the element electrodes 76A and 76B in an organic atmosphere and in a vacuum respectively. It is because electron emission efficiency from the electron emission part 411D increases high. The element electrode 76A, the element electrode 76B corresponding to the element electrode 76A, and the conductive thin film 411F in which the electron emission part 411D is provided are electron emission elements. Also, each electron emission element corresponds to each pixel region.

Figure 31:
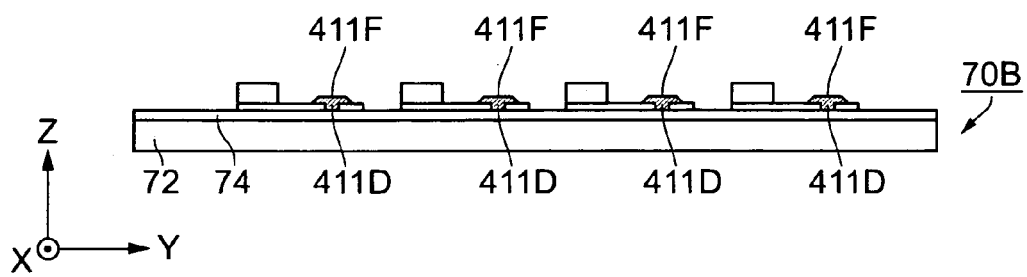
FIG. 31 is a diagram explaining a method of manufacturing a display device of the fifth embodiment.

As shown in FIG. 31, the base substrate 70A serves as an electron source substrate 70B by the above-mentioned procedures.

Figure 32:
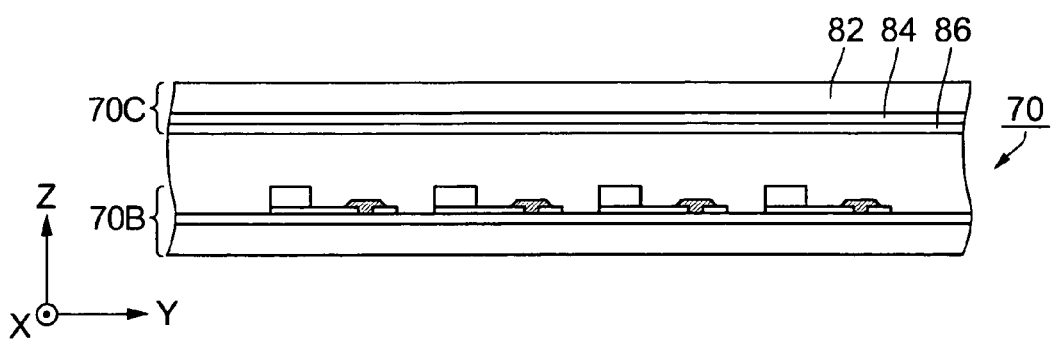
FIG. 32 is a schematic drawing illustrating a section of a display device manufactured by the method of the fifth embodiment.

Then, as shown in FIG. 32, the electron source substrate 70B and the front substrate 70C are bonded by a known method to obtain an image display device 70. The front substrate 70C includes a glass substrate 82, a plurality of fluorescence parts 84 arranged on the glass substrate 82 in a matrix form, and a metal plate 86 that covers the plurality of fluorescence parts 84. The metal plate 86 functions as an electrode that accelerates an electron beam from the electron emission part 411D. The electron source substrate 70B and the front substrate 70C are aligned such that each electron element faces each of the plurality of fluorescence parts 84. Space between the electron source substrate 70B and the front substrate 70C is kept at a vacuum.

The image display device 70 that includes the above-mentioned electron emission elements may be called surface-conduction electron-emitter display (SED) or field emission display (FED). In the specification, the image display device etc., that utilizes liquid crystal display devices, electroluminescence display devices, plasma display devices, and electron emission elements are described as "electro-optic device". Here, "electro-optic device" described in the specification is not limited to the device that utilizes changes of optical characteristics (so-called electro-optic effects) such like changes in birefringence, optical rotating, or light scattering, means all of the devices that emits, transmits, or reflects light in accordance with applied signal voltage.

What is claimed is:

1. A method of coating a base substrate with a liquid material using an ejection device provided with an ejection head including a plurality of nozzles arranged in an X-axis direction and a stage, the method comprising:
    (A) setting the base substrate including a part to be ejected with the liquid material on the stage;
    (B) changing a relative position of the ejection head with respect to the stage to a first direction that is substantially orthogonal to the X-axis direction while maintaining a relative x-coordinate of the ejection head with respect to the stage to a first relative x-coordinate;
    (C) ejecting the liquid material from a first nozzle to the part to be ejected upon positioning the first nozzle among the plurality of nozzles at a region corresponding to the part to be ejected;
    (D) changing the relative position of the ejection head with respect to the stage to the X-axis direction such that the relative x-coordinate of the ejection head with respect to the stage coincides with a second relative x-coordinate;
    (E) changing the relative position of the ejection head with respect to the stage to an opposite direction of the first direction while maintaining the relative x-coordinate of the ejection head with respect to the stage to the second relative x-coordinate;
    (F) ejecting the liquid material from a second nozzle to the part to be ejected upon positioning the second nozzle among the plurality of nozzles at the region corresponding to the part to be ejected;
    (G) removing the base substrate from the stage after step (F);
    (H) setting a second base substrate on the stage, the second base substrate including a second part to be ejected with the liquid material;
    (I) changing the relative position of the ejection head with respect to the stage to the first direction while maintaining the relative x-coordinate of the ejection head with respect to the stage to the second relative x-coordinate;
    (J) ejecting the liquid material from a third nozzle to the part to be ejected upon positioning the third nozzle among the plurality of nozzles at a region corresponding to the second part to be ejected;
    (K) changing the relative position of the ejection head with respect to the stage to the X-axis direction such that the relative x-coordinate of the ejection head with respect to the stage coincides with the first relative x-coordinate;
    (L) changing the relative position of the ejection head with respect to the stage to the opposite direction while maintaining the relative x-coordinate of the ejection head with respect to the stage to the first relative x-coordinate; and
    (M) ejecting the liquid material from a fourth nozzle to the part to be ejected upon positioning the fourth nozzle among the plurality of nozzles at the region corresponding to the second part to be ejected.

2. A method of manufacturing a color filter substrate using an ejection device provided with an ejection head including a plurality of nozzles arranged in an X-axis direction and a stage, the method comprising:
    (A) setting the base substrate including a part to be ejected with a liquid color filter material on the stage;
    (B) changing a relative position of the ejection head with respect to the stage to a first direction that is substantially orthogonal to the X-axis direction while maintaining a relative x-coordinate of the ejection head with respect to the stage to a first relative x-coordinate;
    (C) ejecting the liquid color filter material from a first nozzle to the part to be ejected upon positioning the first nozzle among the plurality of nozzles at a region corresponding to the part to be ejected;
    (D) changing the relative position of the ejection head with respect to the stage to the X-axis direction such that the relative x-coordinate of the ejection head with respect to the stage coincides with a second relative x-coordinate;
    (E) changing the relative position of the ejection head with respect to the stage to an opposite direction of the first direction while maintaining the relative x-coordinate of the ejection head with respect to the stage to the second relative x-coordinate;
    (F) ejecting a liquid color filter material from a second nozzle to the part to be ejected upon positioning the second nozzle among the plurality of nozzles at the region corresponding to the part to be ejected;
    (G) removing the base substrate from the stage after step (F);
    (H) setting a second base substrate on the stage, the second base substrate including a second part to be ejected with a liquid color filter material;
    (I) changing the relative position of the ejection head with respect to the stage to the first direction while maintaining the relative x-coordinate of the ejection head with respect to the stage to the second relative x-coordinate;
    (J) ejecting a liquid color filter material from a third nozzle to the second part to be ejected upon positioning the third nozzle among the plurality of nozzles at a region corresponding to the part to be ejected;
    (K) changing the relative position of the ejection head with respect to the stage to the X-axis direction such that the relative x-coordinate of the ejection head with respect to the stage coincides with the first relative x-coordinate;
    (L) changing the relative position of the ejection head with respect to the stage to the opposite direction while maintaining the relative x-coordinate of the ejection head with respect to the stage to the first relative x-coordinate; and
    (M) ejecting the liquid color filter material from a fourth nozzle to the second part to be ejected upon positioning the fourth nozzle among the plurality of nozzles at the region corresponding to the part to be ejected.

3. A method of manufacturing an electroluminescence display device using an ejection device provided with an ejection head including a plurality of nozzles arranged in an X-axis direction and a stage, the method comprising:
    (A) setting the base substrate including a part to be ejected with a liquid luminous material on the stage;
    (B) changing a relative position of the ejection head with respect to the stage to a first direction that is substantially orthogonal to the X-axis direction while maintaining a relative x-coordinate of the ejection head with respect to the stage to a first relative x-coordinate;

(C) ejecting the liquid luminous material from a first nozzle to the part to be ejected upon positioning the first nozzle among the plurality of nozzles at a region corresponding to the part to be ejected;

(D) changing the relative position of the ejection head with respect to the stage to the X-axis direction such that the relative x-coordinate of the ejection head with respect to the stage to a second relative x-coordinate;

(F) changing the relative position of the ejection head with respect to the stage to an opposite direction of the first direction while maintaining the relative x-coordinate of the ejection head with respect to the stage to the second relative x-coordinate;

(F) ejecting the liquid luminous material from a second nozzle to the part to be ejected upon positioning the second nozzle among the plurality of nozzles at the region corresponding to the part to be ejected;

(G) removing the base substrate from the stage after step (F);

(H) setting a second base substrate on the stage, the second base substrate including a second part to be ejected with a liquid luminous material;

(I) changing the relative position of the ejection head with respect to the stage to the first direction while maintaining the relative x-coordinate of the ejection head with respect to the stage to the second relative x-coordinate;

(J) ejecting the liquid luminous material from a third nozzle to the second part to be ejected upon positioning the third nozzle among the plurality of nozzles at a region corresponding to the part to be ejected;

(K) changing the relative position of the ejection head with respect to the stage to the X-axis direction such that the relative x-coordinate of the ejection head with respect to the stage coincides with the first relative x-coordinate;

(L) changing the relative position of the ejection head with respect to the stage to the opposite direction while maintaining the relative x-coordinate of the ejection head with respect to the stage to the first relative x-coordinate; and (M) ejecting the liquid luminous material from a fourth nozzle to the second part to be ejected upon positioning the fourth nozzle among the plurality of nozzles at the region corresponding to the part to be ejected.

4. A method of manufacturing a plasma display device using an ejection device provided with an ejection head including a plurality of nozzles arranged in an X-axis direction and a stage, the method comprising:

(A) setting the base substrate including a part to be ejected with a liquid luminescence material on the stage;

(B) changing a relative position of the ejection head with respect to the stage to a first direction that is substantially orthogonal to the X-axis direction while maintaining a relative x-coordinate of the ejection head with respect to the stage to a first relative x-coordinate;

(C) ejecting the liquid luminescence material from a first nozzle to the part to be ejected upon positioning the first nozzle among the plurality of nozzles at a region corresponding to the part to be ejected;

(D) changing the relative position of the ejection head with respect to the stage to the X-axis direction such that a relative x-coordinate of the ejection head with respect to the stage coincides with a second relative x-coordinate;

(E) changing the relative position of the ejection head with respect to the stage to an opposite direction of the first direction while maintaining the relative x-coordinate of the ejection head with respect to the stage to the second relative x-coordinate;

(F) ejecting the liquid luminescence material from a second nozzle to the part to be ejected upon positioning the second nozzle among the plurality of nozzles at the region corresponding to the part to be ejected;

(G) removing the base substrate from the stage after step (F);

(H) setting a second base substrate on the stage, the second base substrate including a second part to be ejected with a liquid luminescence material;

(I) changing the relative position of the ejection head with respect to the stage to the first direction while maintaining the relative x-coordinate of the ejection head with respect to the stage to the second relative x-coordinate;

(J) ejecting the liquid luminescence material from a third nozzle to the second part to be ejected upon positioning the third nozzle among the plurality of nozzles at a region corresponding to the part to be ejected;

(K) changing the relative position of the ejection head with respect to the stage to the X-axis direction such that the relative x-coordinate of the ejection head with respect to the stage coincides with the first relative x-coordinate;

(L) changing the relative position of the ejection head with respect to the stage to the opposite direction while maintaining the relative x-coordinate of the ejection head with respect to the stage to the first relative x-coordinate; and (M) ejecting the liquid luminescence material from a fourth nozzle to the second part to be ejected upon positioning the fourth nozzle among the plurality of nozzles at the region corresponding to the part to be ejected.

* * * * *